(12) United States Patent
Mutschelknaus et al.

(10) Patent No.: US 10,749,085 B2
(45) Date of Patent: *Aug. 18, 2020

(54) ENCAPSULATION OF LIGHT-EMITTING ELEMENTS ON A DISPLAY MODULE

(71) Applicant: Daktronics, Inc., Brookings, SD (US)

(72) Inventors: Shannon Lee Mutschelknaus, Aurora, SD (US); Jordan Gab, Seattle, WA (US); Nathan Lane Nearman, Brookings, SD (US); Ryan J. Nielsen, Volga, SD (US); Ryan Hemiller, Brookings, SD (US)

(73) Assignee: Daktronics, Inc., Brookings, SD (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/125,006

(22) Filed: Sep. 7, 2018

(65) Prior Publication Data

US 2019/0006565 A1 Jan. 3, 2019

Related U.S. Application Data

(63) Continuation of application No. 15/141,525, filed on Apr. 28, 2016, now Pat. No. 10,103,297, which is a
(Continued)

(51) Int. Cl.
*H01L 33/56* (2010.01)
*H01L 33/62* (2010.01)
(Continued)

(52) U.S. Cl.
CPC ............ *H01L 33/56* (2013.01); *G09F 9/3026* (2013.01); *G09F 9/33* (2013.01); *G09F 27/008* (2013.01);
(Continued)

(58) Field of Classification Search
None
See application file for complete search history.

(56) References Cited

U.S. PATENT DOCUMENTS

| 5,949,581 A | 9/1999 | Kurtenbach et al. |
| 6,523,976 B1 | 2/2003 | Turnbull et al. |
| (Continued) | | |

FOREIGN PATENT DOCUMENTS

| AU | 2013360053 B2 | 4/2016 |
| CN | 1402319 A | 3/2003 |
| (Continued) | | |

OTHER PUBLICATIONS

"U.S. Appl. No. 14/095,584, Response filed Jun. 2, 2015 to Non Final Office Action dated Mar. 3, 2015", 13 pgs.
(Continued)

*Primary Examiner* — Ashok Patel
(74) *Attorney, Agent, or Firm* — Schwegman Lundberg & Woessner, P.A.

(57) ABSTRACT

A display module comprises a circuit board having a front face, a plurality of light-emitting elements electrically coupled to the front face of the circuit board, a polymer encapsulating member adhered to the front face of the circuit board, the polymer encapsulating member substantially covering at least a portion of the circuit board and a portion of the plurality of light-emitting elements, the polymer encapsulating member substantially sealing the portion of the circuit board and the portion of the plurality of light-emitting elements, and an ultraviolet-radiation diminishing component in the polymer encapsulating member or on one or more of at least a portion of the circuit board or at least a portion of each of the light-emitting elements, wherein the ultraviolet-radiation diminishing component filters, blocks, or reflects more ultraviolet radiation than would be filtered,
(Continued)

blocked, or reflected by the polymer encapsulating member without the ultraviolet-radiation diminishing component.

18 Claims, 9 Drawing Sheets

Related U.S. Application Data continuation-in-part of application No. 14/861,403, filed on Sep. 22, 2015, now Pat. No. 9,538,588, which is a continuation of application No. 14/095,584, filed on Dec. 3, 2013, now Pat. No. 9,172,929.

(60) Provisional application No. 61/735,346, filed on Dec. 10, 2012.

(51) Int. Cl.
| | |
|---|---|
| H01L 27/15 | (2006.01) |
| G09F 27/00 | (2006.01) |
| G09F 9/302 | (2006.01) |
| G09F 9/33 | (2006.01) |
| H05B 33/04 | (2006.01) |
| H04N 9/30 | (2006.01) |

(52) U.S. Cl.
CPC .............. *H01L 27/15* (2013.01); *H01L 33/62* (2013.01); *H04N 9/30* (2013.01); *H05B 33/04* (2013.01)

(56) References Cited

U.S. PATENT DOCUMENTS

| | | | |
|---|---|---|---|
| 7,745,818 | B2 | 6/2010 | Sofue et al. |
| 7,963,680 | B2 | 6/2011 | Yoon et al. |
| 9,052,092 | B2* | 6/2015 | Wendler .................... G09F 9/33 |
| 9,172,929 | B2 | 10/2015 | Mutschelknaus et al. |
| 9,538,588 | B2 | 1/2017 | Mutschelknaus et al. |
| 10,103,297 | B2 | 10/2018 | Mutschelknaus et al. |
| 2003/0042844 | A1 | 3/2003 | Matsumura et al. |
| 2006/0075666 | A1 | 4/2006 | Thielemans et al. |
| 2008/0078733 | A1 | 4/2008 | Nearman et al. |
| 2009/0021497 | A1* | 1/2009 | Wendler ................ G06F 3/1446 345/204 |
| 2009/0021529 | A1* | 1/2009 | Wendler .................... G09F 9/33 345/619 |
| 2010/0127288 | A1 | 5/2010 | Kuo et al. |
| 2011/0215342 | A1 | 9/2011 | Oliver |
| 2012/0112340 | A1 | 5/2012 | Lin et al. |
| 2013/0050227 | A1* | 2/2013 | Petersen ............... H01L 23/053 345/501 |
| 2013/0070480 | A1 | 3/2013 | Griffin et al. |
| 2014/0160363 | A1 | 6/2014 | Mutschelknaus et al. |
| 2014/0168975 | A1 | 6/2014 | Ng et al. |
| 2015/0314941 | A1 | 11/2015 | Ramadas et al. |
| 2016/0014854 | A1 | 1/2016 | Mutschelknaus et al. |
| 2016/0088756 | A1 | 3/2016 | Ramadas |
| 2016/0247983 | A1 | 8/2016 | Mutschelknaus et al. |
| 2017/0110037 | A1 | 4/2017 | Mutschelknaus et al. |

FOREIGN PATENT DOCUMENTS

| | | |
|---|---|---|
| CN | 1520448 A | 8/2004 |
| CN | 2775785 Y | 4/2006 |
| CN | 101064247 A | 10/2007 |
| CN | 101261985 A | 9/2008 |
| CN | 101667372 A | 3/2010 |
| CN | 101669187 A | 3/2010 |
| CN | 101680639 A | 3/2010 |
| CN | 101842856 A | 9/2010 |
| CN | 102232250 A | 11/2011 |
| CN | 102648426 A | 8/2012 |
| CN | 102709448 A | 10/2012 |
| CN | 202871786 U | 4/2013 |
| CN | 104937656 B | 10/2018 |
| CN | 109256050 A | 1/2019 |
| DE | 3827083 A1 | 2/1990 |
| DE | 102005050947 A1 | 4/2007 |
| EP | 1710847 A2 | 10/2006 |
| EP | 1793245 A2 | 6/2007 |
| EP | 2190040 A2 | 5/2010 |
| EP | 2929524 | 3/2017 |
| JP | 2007101932 A | 4/2007 |
| TW | 201140889 A | 11/2011 |
| TW | 201202765 A | 1/2012 |
| WO | WO-2004084163 A1 | 9/2004 |
| WO | WO-2014093057 A1 | 6/2014 |

OTHER PUBLICATIONS

"U.S. Appl. No. 14/095,584, Interview Summary dated May 13, 2015", 3 pgs.
"U.S. Appl. No. 14/095,584, Non Final Office Action dated Mar. 3, 2015", 10 pgs.
"U.S. Appl. No. 14/095,584, Notice of Allowance dated Jun. 22, 2015", 8 pgs.
"U.S. Appl. No. 14/861,403, Non Final Office Action dated Mar. 29, 2016", 8 pgs.
"U.S. Appl. No. 14/861,403, Notice of Allowance dated Aug. 19, 2016", 7 pgs.
"U.S. Appl. No. 14/861,403, Preliminary Amendment filed Sep. 25, 2015", 6 pgs.
"U.S. Appl. No. 14/861,403, Response filed Jul. 29, 2016 to Non Final Office Action dated Mar. 29, 2016", 14 pgs.
"U.S. Appl. No. 15/141,525, Corrected Notice of Allowability dated Jul. 6, 2018", 4 pgs.
"U.S. Appl. No. 15/141,525, Ex Parte Quayle Action mailed Feb. 26, 2018", 10 pgs.
"U.S. Appl. No. 15/141,525, Notice of Allowance dated Jun. 8, 2018", 7 pgs.
"U.S. Appl. No. 15/141,525, Response filed Apr. 26, 2018 to Ex Parte Quayle Action mailed Feb. 26, 2018", 8 pgs.
"U.S. Appl. No. 15/141,525, Response filed Nov. 13, 2017 to Restriction Requirement dated Aug. 24, 2017", 11 pgs.
"U.S. Appl. No. 15/141,525, Restriction Requirement dated Aug. 24, 2017", 8 pgs.
"U.S. Appl. No. 15/392,900, Non Final Office Action dated Feb. 14, 2017", 8 pgs.
"Chinese Application Serial No. 201380069983.8, Decision of Rejection dated Jan. 4, 2018", w. English Translation, 13 pgs.
"Chinese Application Serial No. 201380069983.8, Examiner Interview Summary dated May 21, 2018", 6 pgs.
"Chinese Application Serial No. 201380069983.8, Office Action dated Apr. 18, 2017", W/ English Translation, 20 pgs.
"Chinese Application Serial No. 201380069983.8, Office Action dated Sep. 20, 2017", 16 pgs.
"Chinese Application Serial No. 201380069983.8, Office Action dated Oct. 9, 2016", (With English Translation), 19 pgs.
"Chinese Application Serial No. 201380069983.8, Response filed Feb. 24, 2017 to Office Action dated Oct. 10, 2016", with English Claims, 26 pgs.
"Chinese Application Serial No. 201380069983.8, Response filed Mar. 30, 2018 to Decision of Rejection dated Jan. 4, 2018", w/ English Claims, 14 pgs.
"Chinese Application Serial No. 201380069983.8, Response filed May 31, 2018", with English translation of claims, 37 pgs.
"Chinese Application Serial No. 201380069983.8, Response filed Jun. 30, 2017 to Office Action dated Apr. 18, 2017", 22 pgs.
"Chinese Application Serial No. 201380069983.8, Response filed Dec. 1, 2017 to Office Action dated Sep. 20, 2017", 12 pgs.
"European Application Serial No. 13814300.3, Office Action dated Jul. 17, 2015", 2 pgs.
"European Application Serial No. 13814300.3, Response filed Jan. 11, 2016 to Office Action dated Jul. 17, 2015", 24 pgs.
"European Application Serial No. 17150650.4, Extended European Search Report dated Feb. 28, 2017", 8 pgs.

(56) References Cited

OTHER PUBLICATIONS

"European Application Serial No. 17150650.4, Response filed Dec. 13, 2017", 12 pgs.
"International Application Serial No. PCT/US2013/072834, International Preliminary Report on Patentability dated Jun. 25, 2015", 8 pgs.
"International Application Serial No. PCT/US2013/072834, International Search Report dated Feb. 24, 2014", 5 pgs.
"International Application Serial No. PCT/US2013/072834, Written Opinion dated Feb. 24, 2014", 6 pgs.
"Selection of CAS Achievements and Extension 1996-1997", CAS Application Research & Development Department, CAS Finance & Planning Department, without English Translation, 109.
Yan, Zhao, et al., College Physics, vol. 2, Without English Translation, (Sep. 30, 2009) 229-231.
"European Application Serial No. 17150650.4, Communication Pursuant to Article 94(3) EPC dated Dec. 12, 2019", 6 pgs.
"Chinese Application Serial No. 201811054069.7, Office Action dated Apr. 20, 2020", w/ English translation, 12 pgs.
"European Application Serial No. 17150650.4, Response filed Jun. 2, 2020 to Communication Pursuant to Article 94(3) EPC dated Dec. 12, 2019", 13 pgs.

* cited by examiner

ENCAPSULATION OF LIGHT-EMITTING ELEMENTS ON A DISPLAY MODULE

CLAIM OF PRIORITY

This application is a continuation of and claims the benefit of priority under 35 U.S.C. § 120 to U.S. application Ser. No. 15/141,525, filed Apr. 28, 2016, entitled "ENCAPSULATION OF LIGHT-EMITTING ELEMENTS ON A DISPLAY MODULE," which application is a continuation in part and claims the benefit of priority under 35 U.S.C. § 120 to U.S. patent application Ser. No. 14/861,403, filed Sep. 22, 2015, entitled "ENCAPSULATION OF LIGHT-EMITTING ELEMENTS ON A DISPLAY MODULE," which is a continuation of and claims the benefit of priority under 35 U.S.C. § 120 to U.S. application Ser. No. 14/095,584, filed Dec. 3, 2013, entitled "ENCAPSULATION OF LIGHT-EMITTING ELEMENTS ON A DISPLAY MODULE," which claims the benefit of priority under 35 U.S.C. § 119(e) to U.S. Provisional Application Ser. No. 61/735,346, filed Dec. 10, 2012, entitled "ENCAPSULATION OF LIGHT-EMITTING ELEMENTS ON A DISPLAY MODULE," each of which is hereby incorporated by reference in its entirety.

BACKGROUND

Examples of video or image display modules incorporate an arrangement of different colored light-emitting elements, such as light-emitting diodes (LEDs), for example red-green-blue element pixel packages. The pixel packages or other light-emitting element arrangements can be coupled to a circuit board. In some examples, the display module is exposed to the surrounding environment, such as in video or image displays that are used outdoors, such as sporting venue video or image displays.

SUMMARY

This patent document discloses, among other things, a display module and a display formed from a plurality of display modules mounted to a support chassis. Each display module includes a circuit board with a plurality of light-emitting elements that are mounted to a face of the circuit board. A polymer encapsulating member is adhered to the circuit board face. In some examples, the polymer encapsulating member is adhered to at least a portion of the circuit board face and at least a portion of one or more of the plurality of light-emitting elements. The polymer encapsulating member seals the portion of the face of the circuit board and the portion of each light-emitting element to which it is adhered, for example by sealing the circuit board and electronics mounted thereto from the surrounding environment.

This disclosure also describes a display module comprising a circuit board having a front face, a plurality of light-emitting elements electrically coupled to the front face of the circuit board, and a polymer encapsulating member adhered to the front face of the circuit board. The polymer encapsulating member substantially covers at least a portion of the circuit board and a portion of the plurality of light-emitting elements. The polymer encapsulating member substantially seals the portion of the circuit board and the portion of the plurality of light-emitting elements. An ultraviolet-radiation diminishing component can be incorporated into the polymer encapsulating member or on one or more of the circuit board or at least a portion of each of the light-emitting elements, so that the ultraviolet-radiation diminishing component filters, blocks, or reflects more ultraviolet radiation than would be filtered, blocked, or reflected by the polymer encapsulating member without the ultraviolet-radiation diminishing component This disclosure also describes a display module comprising a circuit board having a front face, a plurality of light-emitting elements electrically coupled to the front face of the circuit board, and a polymer encapsulating member adhered to the front face of the circuit board. The polymer encapsulating member substantially covers at least a portion of the circuit board and a portion of the plurality of light-emitting elements. The polymer encapsulating member is shaped over each of the plurality of light-emitting elements to form a lens over each of the plurality of light-emitting elements.

This disclosure also describes a method for manufacturing a display module. The method comprises providing or receiving a circuit board comprising a plurality of light-emitting elements to a face of the circuit board, forming a polymer encapsulating member over at least a portion of the face of the circuit board and at least a portion of each of the plurality of light-emitting elements, adhering the polymer encapsulating member to the face of the circuit board, and sealing at least the portion of the face of the circuit board and the portion of each of the plurality of light-emitting elements with the polymer encapsulating member These and other examples and features of the present display modules and related methods will be set forth, in part, in the following Detailed Description. This Summary is intended to provide an overview of subject matter of the present disclosure—it is not intended to provide an exclusive or exhaustive explanation. The Detailed Description below is included to provide further information about the present disclosure.

BRIEF DESCRIPTION OF THE DRAWINGS

In the drawings, like numerals can be used to describe similar elements throughout the several views. Like numerals having different letter suffixes can be used to represent different views of similar elements. The drawings illustrate generally, by way of example, but not by way of limitation, various examples discussed in the present document.

DETAILED DESCRIPTION

In the following Detailed Description, reference is made to the accompanying drawings which form a part hereof. The drawings show, by way of illustration, specific examples in which the present display modules and related methods can be practiced. These examples are described in sufficient detail to enable those skilled in the art to practice, and it is to be understood that other embodiments can be utilized and that structural changes can be made without departing from the scope of the present disclosure. Therefore, the following Detailed Description is not to be taken in a limiting sense, and the scope of the present disclosure is defined by the appended claims and their equivalents.

Figure 1:
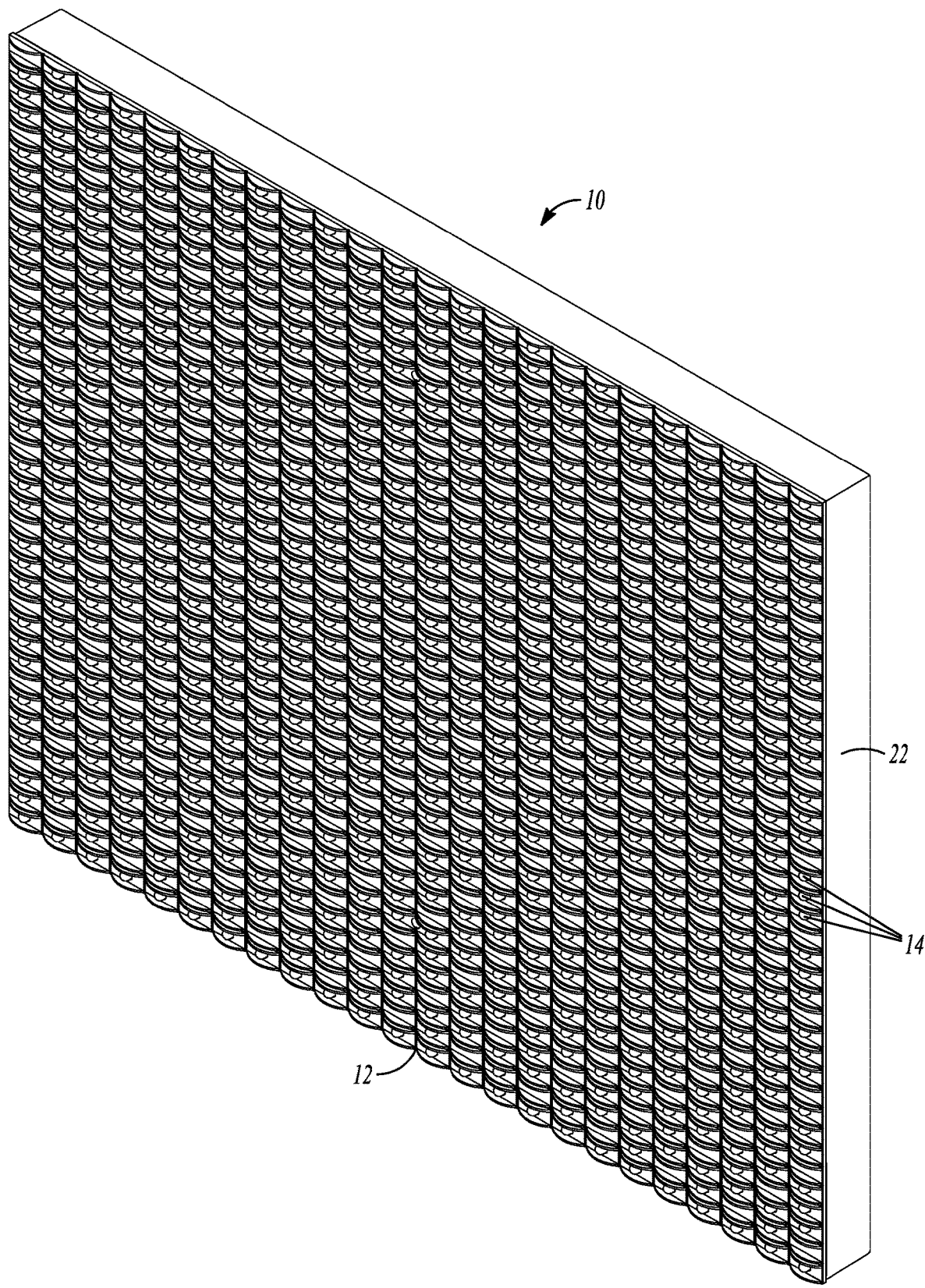
FIG. 1 is a perspective view of an example display module.

FIG. 1 shows a perspective view of a non-limiting example of a display module 10. In some examples, the display module 10 is configured to display one or more of video, graphical, or textual information. For this reasons, the display module 10 will be described hereinafter as a "video display module 10," for the purpose of brevity. The video display module 10 can be combined with a plurality of identical or similar video, graphical, or textual display modules, each referred to herein as "video display modules 10." Each of the plurality of video display modules 10 can be mounted to a support chassis and operated together as a single display. The display can appear as a single display when viewed by a user. Each video display module 10 can include a front display surface 12 that can be configured to provide for a display one or more of graphics, video, or textual content. The front display surface 12 can be formed from a plurality of individual light-emitting elements 14. In an example, the light-emitting elements 14 can comprise light-emitting diode (LED) devices, although other types of light-emitting devices can be used. For the sake of brevity, the remainder of this disclosure will describe the light-emitting elements 14 as LEDs 14. The remainder of this disclosure will also describe the video display module 10 as an LED module 10 and will describe the display that can be formed from a plurality of the LED modules 10 as an LED display. However, a person of skill in the art will understand that the term "LED" or "LED display," as used herein, can include any type of practical light-emitting device, including, but not limited to, light-emitting diodes (LEDs), organic light-emitting diodes (OLEDs), organic light-emitting transistors (OLETs), surface-conduction electron-emitter display devices (SEDs), field-emission display devices (FEDs), laser TV quantum dot liquid crystal display devices, quantum dot display devices (QD-LED), ferro-liquid display devices (FLDs), liquid crystal display devices (LCDs), and thick-film dielectric electroluminescent devices (TDELs), or any other form of light-emitting technology that is or can be used for the display of video, graphical, or textual information.

When multiple LEDs 14 are positioned together in close proximity, various colors can be shown by combining the colors of one or more of the LEDs 14. In an example, the front display surface 12 can include an array of LED pixels, with each LED pixel including a combination of three or more different colored LEDs, such as a pixel comprising a red LED, a green LED, and a blue LED. The red, green, and blue LEDs of each pixel can cooperate to provide a spectrum of colors when one, two, or three of the light emitting elements in a pixel are lit at varying intensities. The front display surface 12 can also provide a black or empty looking surface over a portion of the display, when desired, by deactivating or turning off the LEDs in a particular portion of the front display surface 12. The front display surface 12 of the LED module 10 can be combined with front display surfaces of one or more adjacently-positioned LED modules to form a front display surface of a larger LED display.

Figure 2:
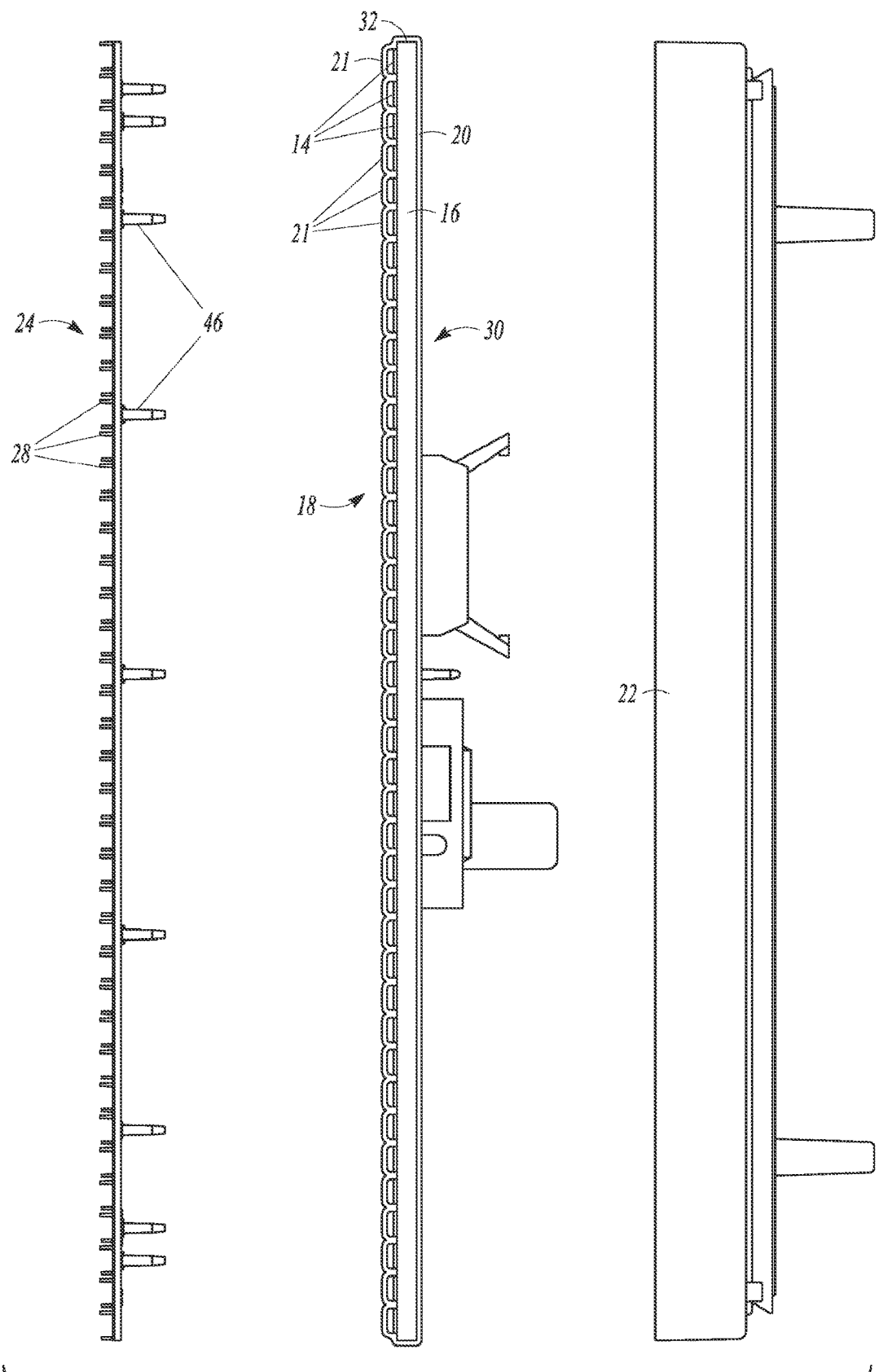
FIG. 2 is an exploded side view of an example display module.
Figure 3:
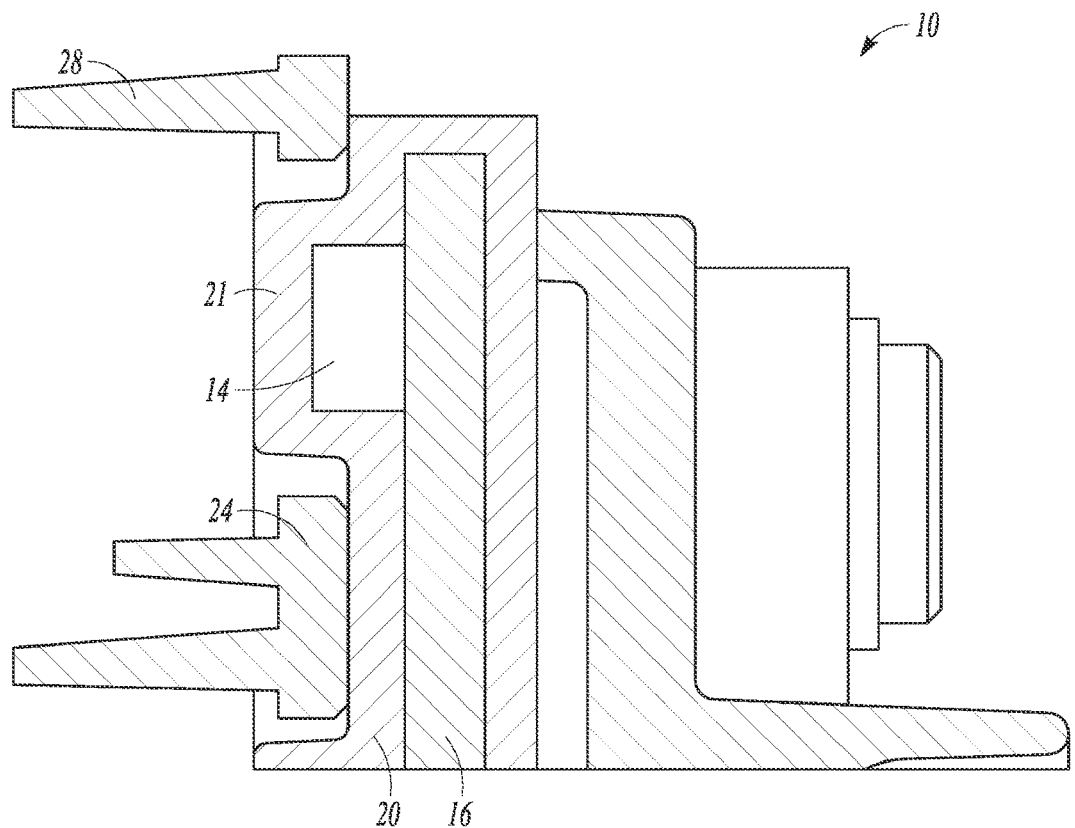
FIG. 3 is a cross-sectional side view of an example of an assembled display module.
Figure 4:
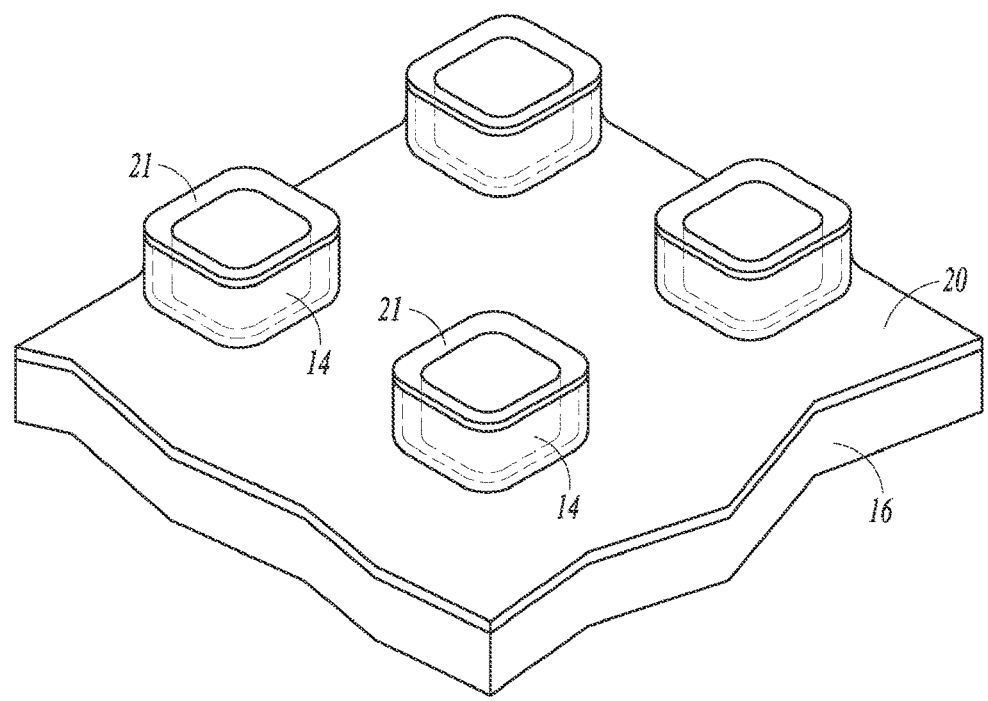
FIG. 4 is a perspective view of several light-emitting display elements mounted to a circuit board that has been encapsulated with an encapsulation mask.
Figure 5:
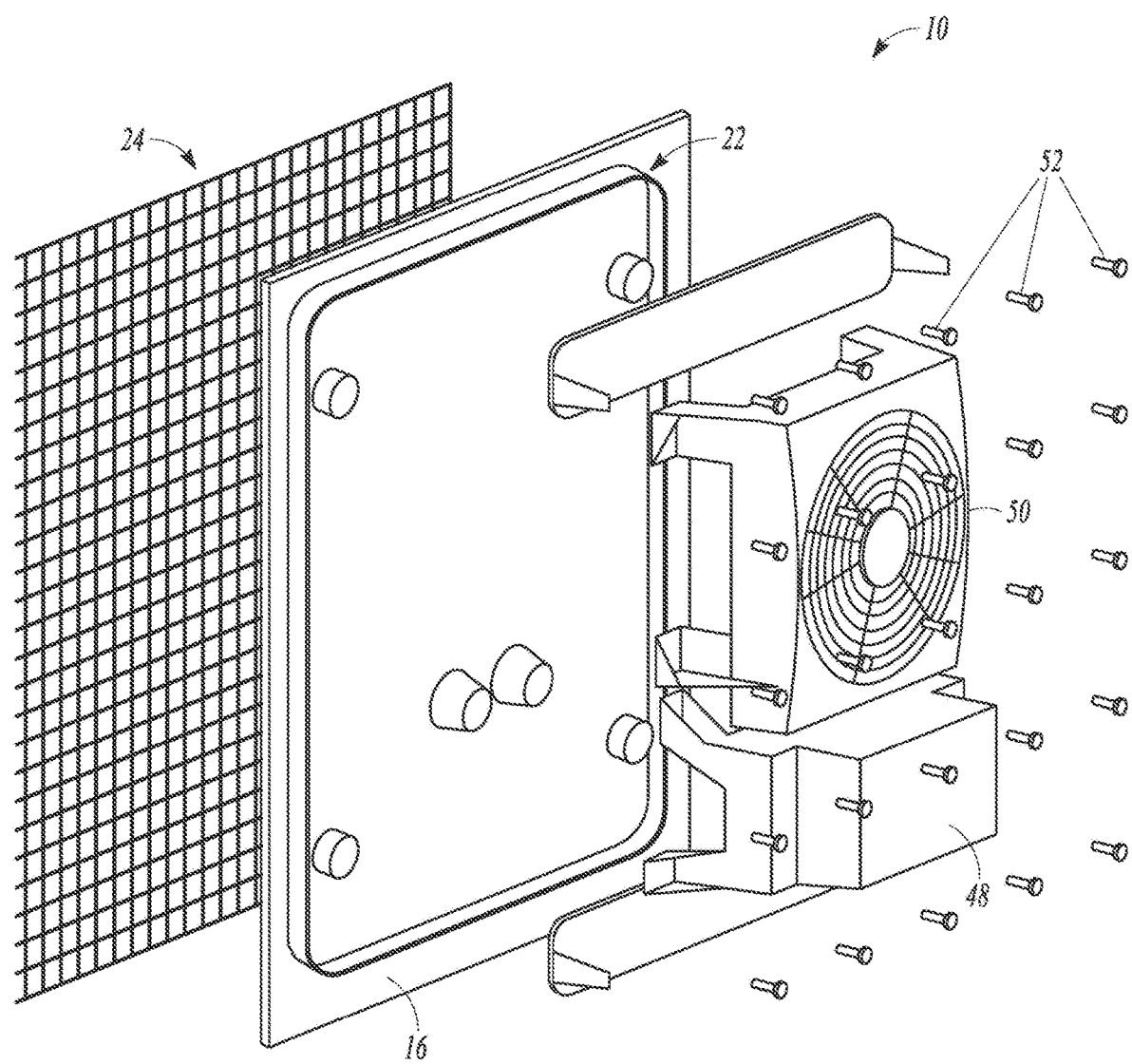
FIG. 5 is an exploded rear perspective view of an example display module.

FIG. 2 shows an exploded side view of the LED module 10. FIG. 3 shows a cross-sectional side view of a portion of the LED module 10. The LED module 10 can include a circuit board 16 and a plurality of LEDs 14. The plurality of LEDs 14 can be mounted and electrically coupled to a front face 18 of the circuit board 16. In an example, the LEDs 14 can comprise surface-mount technology (SMT) LEDs, also referred to as surface-mount LEDs. Surface-mount technology is in contrast to through-hole technology, wherein an LED includes a lead pin that can be inserted through a hole in the circuit board, wherein the lead pin can be soldered to a connection pad on the back side of the circuit board. A surface-mount LED can be mounted directed onto the front face of a circuit board by being soldered directly to solder pads. Surface-mount LEDs can be smaller than through-hole LEDs and can take up less space on the circuit board. Surface-mount LEDs can therefore achieve higher resolution than through-hole LEDs.

Surface-mount LEDs 14 can result in difficulties with sealing the LEDs 14 and other components of the module 10. For example, because surface-mount LEDs are often low profile, with little distance between the surface of the circuit board and the outer face of the LED, it is often necessary to seal over the top of the entire LED. For this reason, the sealing structure or material must be configured so as to not optically interfere with LEDs. In addition, because surface-mount LEDs are soldered to a front surface of the circuit board, the solder can be exposed to ultraviolet (UV) radiation in outdoor video display modules. Many solder materials are UV-sensitive and can break down over time when exposed to UV radiation. An encapsulating mask 20 (which can also be referred to as an encapsulation member) can be formed over at least the front face 18. As described in more detail below, the encapsulating mask 20 can substantially cover and substantially seal at least a portion of the front face 18 and at least a portion of the LEDs 14 mounted to the front face 18. In an example, best seen in FIG. 2, the encapsulating mask 20 can include a plurality of projections 21 that are each configured to receive and cover a corresponding LED 14. The material that forms the encapsulating mask 20 can be substantially transparent so that light emitted from the LEDs 14 can be emitted through the encapsulating mask 20. In an example, the projections 21 can be configured to form a lens that can alter the light emitted by an underlying LED 14. As described in more detail below, the lensing effect of each projection 21 can be configured to provide for an altered viewing angle of the LED 14 compared to the viewing angle that would be experienced without the encapsulating mask 20.

The encapsulated circuit board 16 can be coupled to a housing 22. The LED module 10 can be configured for use in an exterior environment, such as a scoreboard or marquee for an outdoor stadium, arena, or other outdoor venue, or in an interior environment, such as an indoor stadium, arena, or other indoor venue.

A louver 24 can be mounted over the encapsulated front face 18 of the circuit board 16. The louver 24 can include a plurality of openings that can receive the plurality of LEDs 14 so that one or both of the LEDs 14 and the projections 21 protrude at least partially into the LED openings. In an example, each LED opening can be sized and shaped to receive a corresponding LED 14 and a projection 21 of the encapsulation mask 20. The LED openings in the louver 24 can be in a specified pattern and posture corresponding to the location of the LEDs 14 mounted to the circuit board 16. In an example, the circuit board 16 can be aligned with the louver 24 and each LED opening can be registered with a corresponding LED 14. In an example, the louver 24 includes a plurality of louver blades 28. The louver blades 28 can extend at least partially over or under the one or more of the LEDs 14 projecting through the LED openings louver 24. Each louver blade 28 can provide a measure of shade to one or more corresponding LEDs 14 and can thus assist in preventing interaction of the LED 14 with sunlight. For instance, glare, such as sunlight glare off of the LEDs 14, can interfere with projection of a true color from the LED module 10. Accurate representation of graphic and video content can be frustrated by this interference. The shade provided by the louver blades 28 can assist in preventing glare from the LEDs 14 and additionally can allow the LEDs 14 to present a true color or a near true color from a shaded field with minimized interaction with ambient light. Further, the louver blades 28 can provide shadow in an area of the front display surface 12. When it is desired that a portion of the front display surface 12 be dark or present a black surface when video or graphic content is displayed, the shade provided by the louver blades 28 can assist so that the unlit portion of the front display surface 12 can appear black. If glare, such as sunshine glare, is not expected to be an issue, such as when the LED module 10 is configured for use in an interior environment or if the module 10 will be shaded by another structure during use, then the louver blades 28 can be omitted.

FIGS. 2 and 3 show an example of a video display module 10 including a circuit board 16 encapsulated by an encapsulating mask 20. As shown in FIGS. 2 and 3, the encapsulating mask 20 can substantially cover at least the front face 18 of the circuit board 16 and the LEDs 14 mounted to the circuit board 16. In an example, the encapsulating mask 20 can encapsulate all or substantially all of the circuit board front face 18 and can encapsulate all or substantially all of the LEDs 14 mounted to the circuit board 16. In the example shown in FIG. 2, the encapsulating mask 20 can encapsulate all or substantially all of the circuit board 16, e.g., all or substantially all of the front face 18, all or substantially all of an opposing rear face 30 of the circuit board 16, and all or substantially all of the edges 32 of the circuit board 16.

The encapsulating mask 20 can be adhered to all or substantially all of the surfaces that the mask 20 is intended to be sealing. In an example, the encapsulating mask 20 can be formed over the top of the circuit board 16 and mounted LEDs 14, such as by casting or molding the material of the encapsulating mask 20 around or over the circuit board 16, as described in more detail below. Casting or molding of the encapsulating mask 20 can provide for adhesion of the material to substantially the entirety of the front face 18 of the circuit board 16, and if desired substantially the entirety of the rear face 30 as well, to provide for sealing of substantially all of the surfaces that are covered by the encapsulating mask 20.

In an example, described in more detail below, the encapsulating mask 20 is formed by molding a seal material onto or around the circuit board 16. The circuit board 16 can be placed in a mold with a mold cavity having a shape that corresponds to a desired shape of the encapsulating mask 20. The mold can be configured so that the resulting encapsulating mask 20 has a profile that substantially corresponds to or matches a profile of the circuit board 16.

The material of the encapsulation mask 20 can be any material that is suitable for sealing the LEDs 14 and other electronic components mounted to the circuit board 16 from the environment, and particularly from air and moisture. The material of the encapsulation mask 20 can be selected based on at least one of the following characteristics:

(a) the ability of the material to be molded into the desired final shape of the encapsulation mask 20—moldability of the encapsulating material can include how rapidly the material can be molded (with faster molding being preferred), and how easily the material can be dispensed into the mold geometries that form the encapsulating mask 20. The ability to shape the encapsulation mask 20 can also include the tolerance that can be achieved around the LED 14 and the encapsulation mask 20, such as between the projections 21 and the louver 24, as shown, for example, in FIG. 2. A larger tolerance, while still providing for the same pixel pitch, is desirable because it can provide for easier large-scale manufacturing;

(b) the optical properties of the final encapsulation mask 20, including transparency to the light emitted from the LEDs 14, and the percentage of light emitted by an LED 14 that is actually transmitted through the encapsulation mask 20 (e.g., the portion of the light that is not reflected back by the encapsulation mask 20 or absorbed by the encapsulation mask 20);

(c) the temperature stability of the material—in an outdoor video display module 10, the material of the encapsulating mask 20 can be subjected to a wide range of temperatures over a normal annual cycle. In an example, it can be preferred that the encapsulating material be stable at low temperatures down to −40° C., or lower and at high temperatures of up to 85° C. or higher;

(d) the ability to dispense the material without the presence of gas bubbles or to remove the gas bubbles before curing—because the encapsulating mask 20 can cover the LEDs 14, it would be undesirable for the encapsulating mask 20 to include embedded or entrained air bubbles. If an air bubble were to be placed over an LED 14, then the air bubble could interfere with the optics of the LED 14 and create a distorting effect in the video image or video of the video display module 10;

(e) aspects of the curing of the material, including method of curing, speed of curing, and changes that occur with the material during curing (e.g., expansion or contract and shape change);

(f) the ability for the encapsulating mask 20 to seal against water, such as the ability to hermetically seal the LEDs 14 and other components mounted to the circuit board 16;

(g) corrosion resistance for the components sealed by the encapsulation mask 20;

(h) the coefficient of thermal expansion for the material in for the temperatures that are expected to be encountered by the video display module 10—as noted above, outdoor video display modules can experience a wide range of temperatures over an annual cycle (e.g., from −40° C. to 85° C.), such that the encapsulating mask 20 can experience repeated cycles of expansion and contraction. Such expansion and contraction can put stress on the encapsulating mask 20 itself, on the LEDs 14 and other components of the circuit board 16, and on the adhesive connection between the encapsulating mask 20 and the LEDs 14 or the circuit board 16. Preferably, the coefficient of thermal expansion over the expected ambient temperatures is such that they do not cause damage to the circuit board 16, the LEDs 14, or the encapsulating mask 20 and does not become separated from the LEDs 14 or the circuit board 16.

(i) the durability of the material—in particular, the durability of the encapsulating mask 20 with respect to abrasion (e.g., via dust and other debris that can be blown into the video display module 10 by winds), the durability of the encapsulating mask 20 with respect to chemicals that are expected to be encountered by the video display module 10 (e.g., environmental chemicals or pollutants such as salt spray in coastal areas), the encapsulating mask 20 resistance to fire or flame, and resistance to UV radiation, such as resistance of the encapsulating mask 20 to UV;

(j) material reparability—the encapsulating mask 20 can become damaged during manufacturing, transportation, installation, repair, or over time while the video display module 10 is installed. However, it can be undesirable to require replacement of the entire video display module 10 if small damage or a small defect in the encapsulating mask 20 is discovered. Therefore, if the encapsulating mask 20 can be repaired, such as by filling a defect or painting over the defect with the same or a different encapsulating material, it would be desirable. In particular, the ability to repair a defect in the field without having to ship the video display module 10 back to the original manufacturer or another repair facility would be very desirable;

(k) material cost;

(l) the ability of the material to filter out undesirable frequencies of the electromagnetic spectrum. For example, the material of the encapsulating mask 20 can be selected or modified so that it will filter out or block potentially damaging radiation, such as wavelengths of light corresponding to ultraviolet (UV) light. Therefore, in some examples, the encapsulating mask 20 protects components enveloped or covered by the encapsulating mask 20 from degradation due to exposure to the damaging radiation, such as the breakdown of solder materials from exposure to UV light. In addition to the filtering of undesired frequencies (e.g., UV light wavelengths), the material of the encapsulating mask 20 can be selected or modified to allow desired frequencies of the electromagnetic spectrum to pass through the encapsulating mask 20. For example, the material of the encapsulating mask 20 can be selected or modified to filter or block undesired frequencies (e.g., UV light) and to allow visible light, or at least a substantial portion of visible light wavelengths, to pass through the encapsulation mask 20 so that the visible light being emitted by the LEDs 14 will pass through the encapsulating mask 20 and be visible without substantial distortion. In an example, a base material of the encapsulating mask 20 may be unable, by itself, to filter or block undesired frequencies, but may be supplemented with additives, as described in more detail below, that will modify the encapsulating mask 20 and cause it to filter out or block the undesired frequencies, for example by filtering, blocking, or reflecting wavelengths in the ultraviolet spectrum, such as UV light.

The encapsulation mask 20 can be formed from one or more base materials. As used herein when referring to the encapsulation mask 20, the term "base material" can refer to a material or materials that makes up a substantial portion of the weight fraction of the encapsulation mask. The term "base material" can also refer to any material that is present in sufficient quantities that it can form a noticeable and substantial portion of the physical structure of the encapsulation mask 20. In this way, a "base material" can be contrasted with additives, such as described in more detail below, which can alter properties of the base material, but which are not selected to provide a substantial portion of the physical form of the encapsulation mask 20. Examples of base materials that can be used for the encapsulation mask 20 include, but are not limited to, nylons, polycarbonates, silicones and polyurethanes. In an example, the encapsulation mask 20 can be molded from a base material that is a silicone encapsulant, such as silicone electronics encapsulants manufactured by Dow Corning Corp., Midland, Mich., USA, such as Dow Corning EE-1184 silicone encapsulant.

In an example, the term "base material," when referring to the encapsulation mask 20, can refer to one or more materials that make up a majority of the weight fraction, e.g., more than 50 wt %, of the encapsulation mask 20, and in most examples that make up substantially more than 50 wt % of the encapsulation mask, such as at least 60, at least 70, at least 75, at least 80, at least 81, at least 82, at least 83, at least 84, at least 85, at least 86, at least 87, at least 88, at least 89, at least 90, at least 91, at least 92, at least 93, at least 94, at least 95, at least 96, at least 97, at least 98, or at least 99 wt. % of the encapsulation mask. In some examples, there can be only a single composition that would be considered a "base material," such as just a silicone or just a polyurethane.

In some examples, there is only a single composition that is a "base material" of the encapsulating mask 20, such as just a silicone base material or just a polyurethane base material. In such a case, then the single base material would, by itself, make up at least 50 wt % of the encapsulation mask 20 (or any of the other wt % thresholds described above). In other examples, the "base material" of the encapsulation mask 20 includes a blend of two or more materials where each material of the blend may be selected to provide certain characteristics or properties to the encapsulation mask 20. In such a case, each material of the base material blend may, individually, not make up a majority of the weight fraction of the encapsulation mask 20, but each individual component of the blend may make up a substantial portion of the structure of the encapsulation mask 20.

The material of the encapsulation mask 20 can include one or more additives, such as additives that can modify or supplement the properties of the base material of the encapsulation mask 20. As used herein when referring to the material of the encapsulation mask 20, "additive" can refer to a substance that is added to the base material in order to modify, supplement, or enhance the properties of the base material. In an example, an additive provides a functionality for the encapsulation mask 20 that would not occur due to the base material without the presence of the additive. An additive can be one or more compounds or materials that are mixed or blended with the base material, but that do not chemically modify the chemical structure of the base material. An additive can be one or more chemical modifications to the chemical structure of the base material, such as a chemical branching agent, a copolymer block, or a compound that is crosslinked or otherwise chemically bonded to the chemical structure of the base material.

Energy can be transferred from an emitting source to a receiving body, such as through the emission of radiation in the electromagnetic spectrum. The electromagnetic spectrum is separated into different types of radiation, which are typically defined by the wavelength of the emitted radiation. In an example, the electromagnetic spectrum is separated into a visible frequency range, such as is defined by electromagnetic radiation with wavelengths from about 700 nanometers (or nm) to about 400 nm (428-749 terahertz or THz), an ultraviolet (or UV) frequency range, such as is defined by electromagnetic radiation with wavelengths from about 400 nm to about 10 nm (749 THz to 30 petahertz or PHz), and an X-ray frequency range, such as defined by electromagnetic radiation with wavelengths less than about 10 nm (30 PHz).

Energy transmission from an emitting source to a receiving body can be interrupted (e.g., substantially or completely prevented) with the use of a component that filters, blocks, or reflects the radiation. In some examples, a display module, such as the display module 10, includes an ultraviolet-radiation (UV) diminishing component that filters, blocks, or reflects UV from being emitted onto UV-sensitive structures in the display module, including, but not limited to, one or more of: portions of the circuit board 16, the LEDs 14 or a portion of the LEDs 14, one or more electronic components mounted to the circuit board 16 (such as the electronic components 256 of the display module 210 described below with respect of FIG. 10), or a solder for electrically coupling the LEDs or the electronic components to the circuit board 16 (e.g., the solder 260 described below with respect to FIG. 10). In an example, the UV diminishing component filters, blocks, or reflects more UV radiation than would be filtered, blocked, or reflected by the encapsulation mask 20 by itself (e.g., than the encapsulation mask 20 made only from the base material). In some examples, the UV diminishing component filters, reflects, or blocks sufficient UV radiation such that the UV-sensitive structures and components of the display module 10 can have an expected life that is substantially longer than could be achieved without using the UV diminishing component, e.g., for a specified life under normal, year-round outdoor exposure of at least about ten years, for example at least about seven years. In some examples, the UV diminishing component includes one or both of: (a) an additive to the material that forms the encapsulation mask 20, such as an additive combined with a base material and configured to form an encapsulation mask 20; and (b) a coating, such as a blocking coating configured to protect a surface that can degrade with exposure to electromagnetic radiation.

In an example, an additive is added to the base material to form the encapsulation mask 20 that filters out or blocks frequencies of the electromagnetic spectrum. In some examples, the additive includes one or more UV-filtering or UV-blocking additives that, in combination with the base material, allows the encapsulation mask 20 to filter, block, or otherwise limit ultraviolet frequencies, such as UV light, from passing through the encapsulation mask 20 and irradiating the circuit board and electronics on the circuit board. As used herein, the term "filter," when referring to preventing the transmission of certain wavelengths of light, and in particular UV light, through the encapsulation mask 20, can refer to the material of the encapsulation mask 20 only allowing transmission therethrough of a specified wavelength or range of wavelengths at or below a specified transmission percentage threshold. In an example, the transmission percentage threshold is 10% or less, meaning that the encapsulation mask 20 is configured so that no more than 10% of the specified wavelengths of light (e.g., UV light) will be transmitted through the encapsulation mask 20. In some examples, the transmission percentage threshold is specified to be less than 10%, such as 9.5% or less, 9% or less, 8.5% or less, 8% or less, 7.5% or less, 7% or less, 6.5% or less, 6% or less, 5.5% or less, 5% or less, 4.9% or less, 4.8% or less, 4.7% or less, 4.6% or less, 4.5% or less, 4.4% or less, 4.3% or less, 4.2% or less, 4.1% or less, 4% or less, 3.9% or less, 3.8% or less, 3.7% or less, 3.6% or less, 3.5% or less, 3.4% or less, 3.3% or less, 3.2% or less, 3.1% or less, 3% or less, 2.9% or less, 2.8% or less, 2.7% or less, 2.6% or less, 2.5% or less, 2.4% or less, 2.3% or less, 2.2% or less, 2.1% or less, 2% or less, 1.9% or less, 1.8% or less, 1.7% or less, 1.6% or less, 1.5% or less, 1.4% or less, 1.3% or less, 1.2% or less, 1.1% or less, or 1% or less. In an example, a UV-filtering or blocking additive is an ultraviolet absorber, for example by including a type of light stabilizer, that can function to absorb UV radiation, such as by competing with chromophores to absorb UV radiation. In some examples, ultraviolet absorbers convert harmful UV radiation into harmless infrared radiation or heat, which is dissipated through the polymer matrix. In an example, ultraviolet absorbers include compounds such as hydroxybenzophenone and hydroxyphenylbenzotriazole.

Specific compounds can be added to the base material of the encapsulation mask to provide for UV-filtering or UV-blocking. In an example, where the base material comprises a nylon, the UV-filtering or UV-blocking additive includes oxanilides. In an example, where the base material comprises a polycarbonate, the UV-filtering additive includes benzotriazoles.

In an example, a UV-filtering or UV-blocking additive is from about 0.01 to about 15 weight % of the encapsulating mask 20, such as from about 2 weight % to about 6 weight %, for example from about 4 weight % to about 5 weight % of the encapsulating mask 20. In some examples, the UV-filtering additive is less than 15% weight % of the encapsulating mask 20, such as 14.5% or less, 14% or less, 13.5% or less, 13% or less, 12.5% or less, 12% or less, 11.5% or less, 11% or less, 10.5% or less, 10% or less, 9.5% or less, 9% or less, 8.5% or less, 8% or less, 7.5% or less, 7% or less, 6.5% or less, 6% or less, 5.9% or less, 5.8% or less, 5.7% or less, 5.6% or less, 5.5% or less, 5.4% or less, 5.3% or less, 5.2% or less, 5.1% or less, 5.0% or less, 4.9% or less, 4.8% or less, 4.7% or less, 4.6% or less, 4.5% or less, 4.4% or less, 4.3% or less, 4.2% or less, 4.1% or less, 4% or less, 3.9% or less, 3.8% or less, 3.7% or less, 3.6% or less, 3.5% or less, 3.4% or less, 3.3% or less, 3.2% or less, 3.1% or less, 3% or less, 2.9% or less, 2.8% or less, 2.7% or less, 2.6% or less, 2.5% or less, 2.4% or less, 2.3% or less, 2.2% or less, 2.1% or less, 2% or less, 1.9% or less, 1.8% or less, 1.7% or less, 1.6% or less, 1.5% or less, 1.4% or less, 1.3% or less, 1.2% or less, 1.1% or less, or 1% or less of the encapsulating mask 20.

In an example, for a base material including a silicone polymer, such as polydimethylsiloxane (PDMS), the UV-filtering or UV-blocking additive includes at least one of benzophenone, benzotriazole, and octylmethoxy cinnamate.

In some examples, the addition of an additive, such as a UV-filtering or UV-blocking additive, to the base material of the encapsulation mask 20 may not be feasible or desirable. Therefore, in some examples, at least a portion of components of the video display module 10 is protected from undesirable frequencies of the electromagnetic spectrum, such as UV light, with a coating, such as a UV-filtering or UV-blocking coating. A UV-filtering or UV-blocking coating can be used in place of or in addition to UV-filtering or UV-blocking additives in the encapsulation mask 20, for example as described above. For example, there may be instances where a UV-filtering or UV-blocking additive provides adequate filtering or blocking of certain wavelengths of undesired UV light, but may not provide sufficient filtering of other wavelengths. In some examples, a UV-filtering or UV-blocking additive may lose effectiveness after a certain period of time. In such cases, the use of a UV-filtering or UV-blocking coating in addition to one or more UV-filtering or UV-blocking additives in the encapsulating mask 20 can be used.

In an example, a filtering or blocking coating includes one or more materials configured to substantially or completely prevent undesired electromagnetic radiation, such as UV radiation, from irradiating surfaces covered with the filtering or blocking coating. In this way, the filtering or blocking coating provides protection for components or surfaces that can degrade with exposure to the undesired electromagnetic radiation. For example, a UV-filtering or UV-blocking coating can be applied to the circuit board of a display module and any electronics mounted to the circuit board that are susceptible to damage when exposed to UV radiation.

Figure 9:
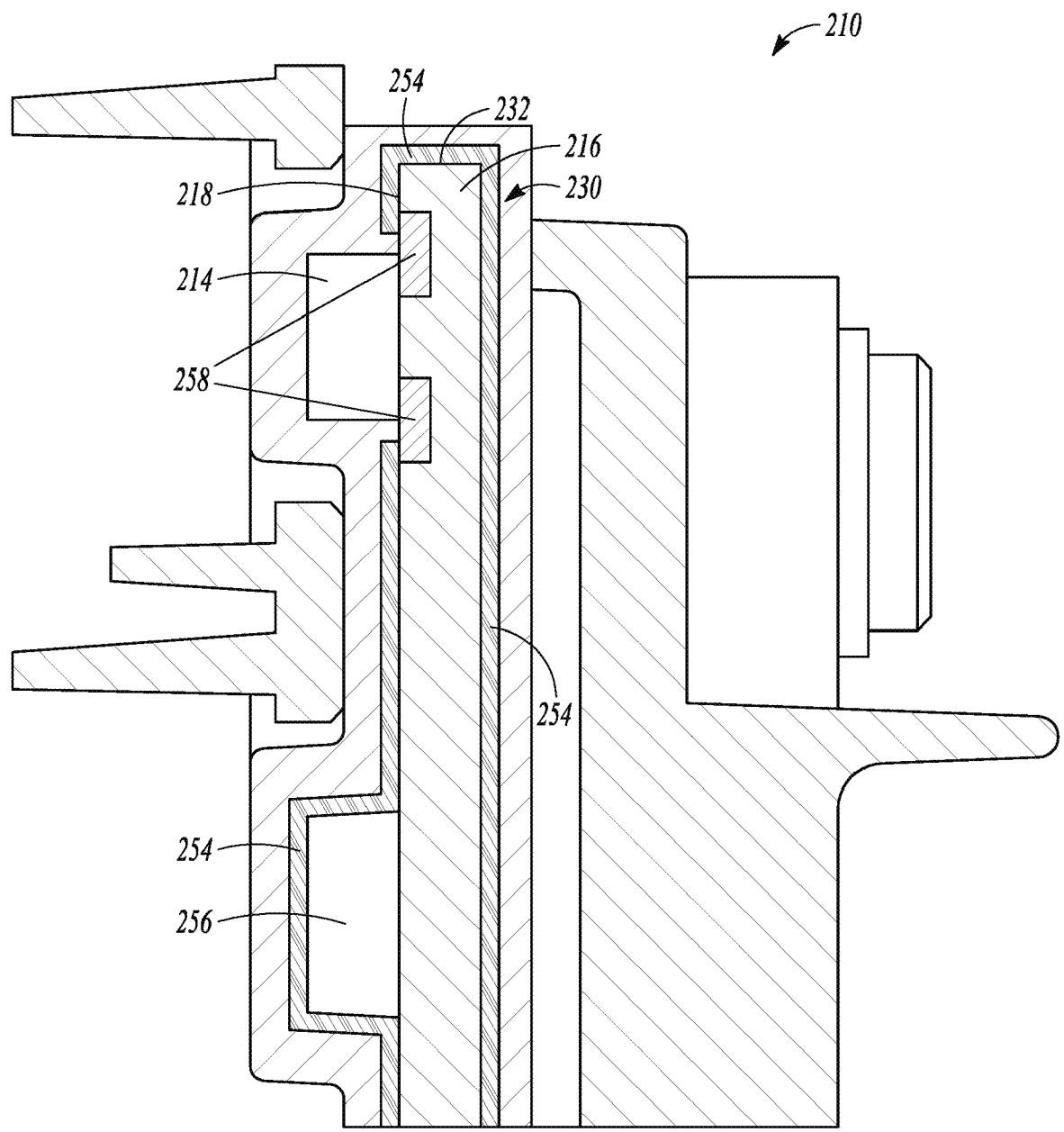
FIG. 9 is a cross sectional view of another example display module that includes a radiation filtering or blocking coating.

FIG. 9 is a cross sectional view of another example display module that includes a radiation filtering or blocking coating. In an example, the module 210 includes a circuit board 216 with a plurality of LEDs 214 (only one LED shown in FIG. 9). A radiation filtering or blocking coating 254 is applied to the circuit board 216. In an example, the radiation filtering or blocking coating 254 is applied as a thin layer of material to completely or substantially completely cover one or more surfaces of the circuit board 216 that may be susceptible to UV damage such that the coating 254 is a UV-filtering or UV-blocking coating 254. In an example, the radiation filtering or blocking coating 254 is applied to one or more of a front surface 218, a rear surface 230, or an edge 232 of the circuit board 216. In the example shown in FIG. 9, the coating 254 is applied to the front surface 218, the edge 232, and at least a portion of the rear surface 230. In another example, shown in FIG. 10, the coating 254 is applied to the front surface 218 of the circuit board 216, and not to the edge 232 or the rear surface 230. In an example, the radiation filtering or blocking coating 254 is applied over at least a portion of one or more electronic components 256 mounted to the front surface 218 of the circuit board 216. In an example, the radiation filtering or blocking coating 254 provides protection for both the front surface 218 of the circuit board 216 and at least a portion of each of the electronic components 256 that are coated.

In an example, the radiation filtering or blocking coating 254 is applied so that the LEDs 214 are readily mountable to the circuit board 216. In an example where the LEDs 214 are surface mount LEDs 214, the radiation filtering or blocking coating 254 is applied before surface mounting the LEDs 214 by applying the coating 254 to the circuit board 216 so that contact pads 258 onto which the surface mount LEDs 214 will be mounted are left exposed, as shown in the example of FIG. 9, e.g., so the contact pads 258 are at least partially uncoated by the radiation filtering or blocking coating 254. In an alternative example, the surface mount LEDs 214 are mounted to the circuit board 216 before applying the radiation filtering or blocking coating 254 so that the coating 254 does not overly cover the contact pads 258.

Figure 10:
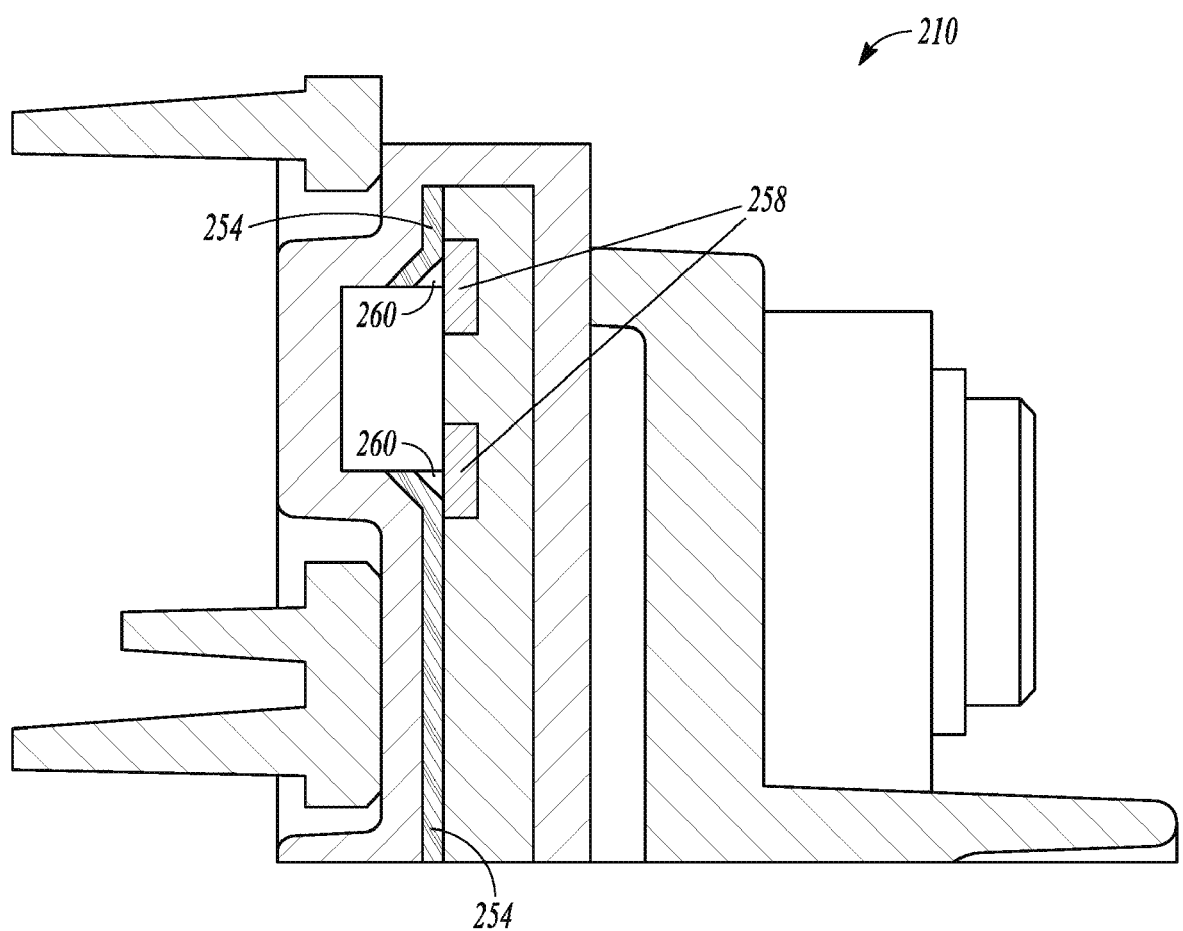
FIG. 10 is a cross sectional view of an example display module with a surface-mount light-emitting element electrically mounted to a circuit board.

FIG. 10 is a cross sectional view of an example display module 210 with a surface-mount LED 214 mounted to the circuit board 216. The surface mount LED 214 is electrically connected to the circuit board 216, such as with solder 260. In an example, the radiation filtering or blocking coating 254 is applied to one or more surfaces of the circuit board 216 to which surface mount LEDs 214 have been electrically connected to protect the circuit board 216 or the solder 260, or both. In an example, the one or more surfaces onto which the coating 254 is applied includes at least one of: one or more surfaces of the circuit board 216 not occupied by the surface mount LEDs 214; one or more surfaces of the solder 260; or at least a portion of one or more surfaces of the LEDs 214 that will not prevent emission of visible light from the LEDs 214 in the form of visual information viewable by an intended audience, such as at least a portion of one or more side surfaces of the LEDs 214, e.g., as shown in the example of FIG. 10.

In an example, the radiation filtering or blocking coating 254 includes a material that can be easily applied to the surfaces to be protected. In an example, the radiation filtering or blocking coating 254 is applied so that it covers all or substantially all of the surfaces that are to be protected, such as to form a barrier on the protected surface or surfaces to the undesired electromagnetic radiation. In an example, the coating 254 includes materials that, at least initially, are in a liquid form, such as a paint, a mastic composition, or an epoxy composition. In an example, the coating 254 includes materials that, at least at some point, are in a dry form, such as a powder coat. In an example, the coating 254 can include one or more additives, such as carbon black (for example a carbon black pigment) or iron oxide, in a quantity sufficient to filter or block radiation, such as UV radiation. Quantities sufficient to filter or block radiation can include a range of one or more additives, such as additives in a range of approximately 0.1% to approximately 50% by weight including a range of approximately 0.5% to approximately 2% by weight. In an example, approximately 1% by weight carbon black including a carbon black pigment can be added to the blocking coating 254. In an example, approximately 1% by weight iron oxide can be added to the blocking coating 254. In an example, additives including combinations of carbon black and iron oxide in various proportions accounting for approximately 1% by weight can be added to the blocking coating 254.

In an example, the radiation filtering or blocking coating 254 includes one or more additives. In an example, the one or more additives of the coating 254 include one or more hydrophobic additives to shed liquids from the protected surface. In an example, the one or more additives of the coating 254 includes one or more materials that can filter, reflect, or absorb an energy sources, such as one or more energy filtering or blocking additives that absorb, block, or reflect radiation of undesirable frequencies, e.g., to protect at least one of the circuit board 216, the electronic components 256, the LEDs 214, or the solder 260 from the undesirable radiation. In an example, the radiation filtering or blocking coating 254 includes one or more materials that block, reflect, or absorb—or substantially block, reflect or absorb—ultraviolet radiation, such as UV light, such that the coating 254 is a UV-filtering or UV-blocking coating 254. In an example, a UV-filtering or UV-blocking coating 254 includes one or more pigments known to substantially block or shield UV radiation, such as a carbon black pigment.

Figure 6:
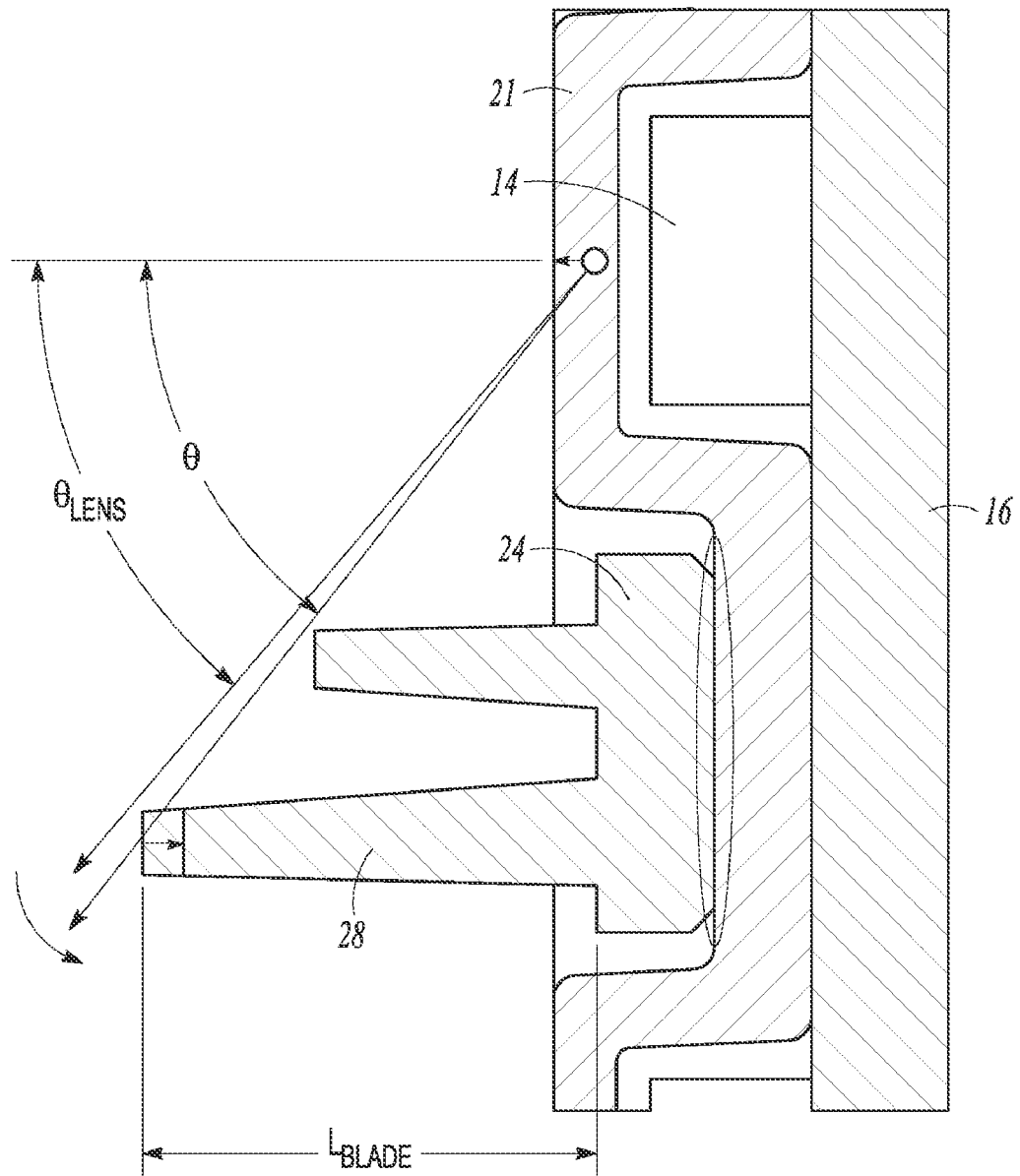
FIG. 6 is a cross-sectional side view of an example display module showing an altered viewing angle due to the use of an encapsulation mask and a lens.

Returning to the module 10 shown in FIGS. 1-6, the encapsulating mask 20 can also form a lens over each of the LEDs 14 to enhance or optimize the optics for light emitted from the LEDs 14. As noted above, a lensing effect of the encapsulating mask 20, e.g., via a lens formed by the projection 21, can provide for an altered viewing angle of the LED 14 compared to the viewing angle that would be experienced without the encapsulating mask 20, as demonstrated in FIG. 6. FIG. 6 shows a natural viewing angle θ of the LED 14 that would occur if the encapsulating mask 20 did not act as a lens for the LED 14 and an altered viewing angle $\theta_{Lens}$ that can occur if the encapsulating mask 20 is configured to act as a lens. As shown, the natural viewing angle θ can be such that a louver blade 28 will interfere with the light being emitted from the LED 14 unless the length $L_{Blade}$ of the louver blade 28 is shortened (which, in turn, can reduce the effectiveness of the louver blade 28 for its purpose of improving contrast of the display module 10). The lens-altered viewing angle $\theta_{Lens}$ can allow for a desired length $L_{Blade}$ of the louver blade 28 without interference with light from the LED 14.

Figure 8:
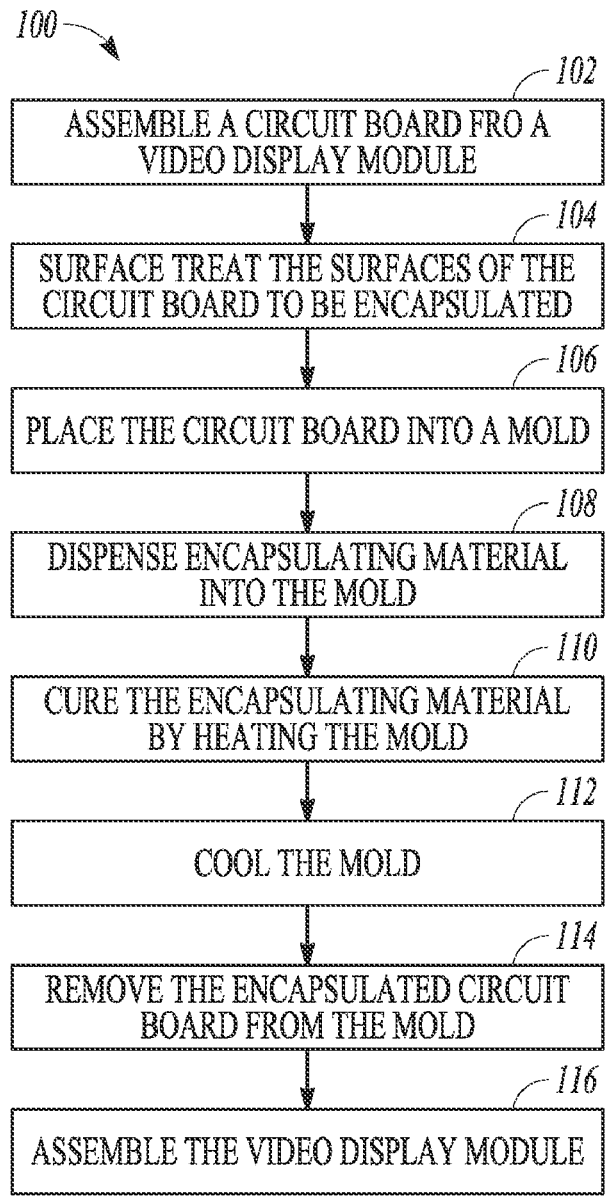
FIG. 8 is a flow chart of an example method of manufacturing a display module.

FIG. 8 shows a flow chart of an example method 100 for manufacturing a video display module, such as module 10, including a video-display element circuit board 16 at least partially encapsulated by an encapsulation mask, such as encapsulation mask 20. The method 100 can include, at 102, assembling a circuit board 16 for a video display module 10, such as by mounting a plurality of light-emitting elements, such as LEDs 14 to a front face 18 of the circuit board 16. Assembling the circuit board 16, at 102, can also include mounting other electrical components that can provide for operation of the video display module 10, such as capacitors and convertor components (e.g., Direct Current-Direct Current convertors. Mounting the LEDs 14 and other electrical components can include soldering the LEDs 14 or components to connection pads (e.g., solder pads) on the circuit board 16, such as by applying a solder paste to the solder pads, placing the LEDs 14 and components onto the solder paste, and reflowing the solder to form a mechanical and electrical connection between the LEDs 14 and other components and the solder pads. Assembling the circuit board 16, at 102, can also include electrically connecting the LEDs 14 and other electrical components, such as by forming the solder pads and conduction pathways, such as traces, on the circuit board 16. Alternatively, the circuit board 16 can be manufactured by a third party, e.g., a vendor or contractor, and received at step 102.

In an example, the encapsulating material that may be desirable for its mechanical properties and durability properties may not form a satisfactory bond with the front face 18 or the LEDs 14. Therefore, some form of surface treatment can be used, at 104, to surface treat at least a portion of the front face 18 or at least a portion of the plurality of LEDs 14, or both. In an example, the surface treatment can comprise chemical treatment of the front face 18 and the LEDs 14. The chemical treatment can comprise treating the surfaces of the front face 18 and the LEDs 14 that are to be covered by the encapsulating mask 20 with one or more chemicals that can alter one or more physical or chemical properties of the treated surfaces. For example, the treating chemical or chemicals can alter bonding sites on the surfaces or the treating chemical can enhance the surface energy of the surfaces.

In an example, treating the surfaces, at 104, can comprise applying a primer material to the surfaces of the front face 18 and the LEDs 14, wherein the primer material can sufficiently bond to the front face 18 and the LEDs 14 as well as to the encapsulating material of the encapsulating mask 20.

In another example, surface treating the LEDs 14 and the circuit board 16, e.g., treating the front face 18, at 104, can include at least one of plasma treatment, flame treatment, and an ultraviolet ozone treatment (also referred to herein as "UVO treatment"), of the surfaces that are to be covered by the encapsulating mask 20. In an example, plasma treatment includes exposing the portions of the circuit board 16 to a plasma, such as an atmospheric plasma treatment. Plasma treatment can activate the surfaces to provide for adhesion of the material of the encapsulating mask 20 to the LEDs 14 and the circuit board 16. In an example, plasma treatment can alter the surface energy of the surfaces of the LEDs 14 or the circuit board 16, or can alter the surface tension of the surfaces of the LEDs 14 or the circuit board 16, or both.

In an example, flame treatment includes exposing the portions of the circuit board 16 to be surface treated to a flame for a short period of time, which can activate the surfaces of the circuit board 16 to promote bonding the encapsulating material. The flame can also be used as a method of delivering one or more compounds that can increase the surface energy of the surfaces to be treated in order to provide for improved adhesion between the surface being treated and the material of the encapsulating mask 20. The flame can be formed by combusting a mixture of a fuel, such as natural gas, and air at a burner. The portions of the circuit board 16 to be treated can be passed through the flame at the burner so that each portion to be flame treated is exposed to the flame for long enough to activate the surfaces, but not so long so as to damage or otherwise alter the circuit board 16, the LEDs 14, or any other electrical components on the circuit board 16. The flame treatment can alter the surface tension of the surfaces of the circuit board 16 or the LEDs 14, or both, or can alter the surface energy of the surfaces. In an example, each portion of the circuit board 16 that is to be flame treated is exposed to the flame for a short period of time, e.g., only a few milliseconds to a half a second.

In an example, UVO treatment includes exposing the portions of the circuit board 16 to be surface-treated to a source of ultraviolet radiation for a specified period of time in the presence of oxygen gas ($O_2$). In an example, the source of ultraviolet radiation comprises an excimer vacuum ultraviolet (VUV) light sources. In some examples, the UVO treatment removes unwanted material on the surfaces being treated, such as organic surface contaminants, e.g., hydrocarbons. In an example, the UVO treatment oxidizes the surface material. For example, oxidation of organic surface contaminants oxidizes the organic compounds of the contaminants, e.g., hydrocarbons, to form $CO_2$ gas, water vapor ($H_2O$), and low-molecular weight compounds that can be more easily removed from the surface, e.g., volatile or gaseous organic or inorganic compounds.

Ultraviolet ionizing radiation, or UV ionizing radiation, can include a UV source of sufficient intensity to ionize a molecule, such as an $O_2$ molecule, into constituent atoms, such as individual oxygen atoms (O.). In some examples, if the ultraviolet radiation has sufficient energy, molecules of the $O_2$ gas are split into single oxygen atoms (O.). Single oxygen atoms are highly reactive, and will typically react with another $O_2$ molecule, resulting in the formation of an ozone molecule ($O_3$). The ozone molecules formed by this reaction will, in some examples, contact and react with contaminants on the surfaces being treated. In some examples, a portion of the single oxygen atoms formed by splitting $O_2$ molecules will also contact and react with the surface contaminants. In an example, the reaction of one or both of single oxygen atoms (O.) or ozone molecules ($O_3$) with the surface contaminants oxidizes the contaminants, converting the contaminants to compounds that can more easily be removed. In some examples, the UVO treatment removes unwanted material on the surfaces being treated, such as organic surface contaminants, e.g., hydrocarbons. In an example, the UVO treatment oxidizes the surface material. For example, oxidation of organic surface contaminants oxidizes the organic compounds of the contaminants, e.g., hydrocarbons, to form $CO_2$ gas, water vapor ($H_2O$), and low-molecular weight compounds that can be more easily removed from the surface, e.g., volatile or gaseous organic or inorganic compounds.

In an example, the UVO treatment activates the surfaces to provide for adhesion of the material of the encapsulating mask 20 to the surface being treated that is better than would be achieved without the UVO treatment. In an example, the UVO treatment alters the surface tension of a treated surface or modifies the surface energy of the treated surface, or both. The modified surface tension or surface energy, or both, allows for better wetting of the material that forms the encapsulation mask 20, e.g., during molding, such as to provide for better bonding between the encapsulation mask 20 and the treated surface. In an example, the UVO treatment treats surfaces of one or more of the LEDs 14, the circuit board 16, and electrical joints between the LEDs 14 and the circuit board 16, e.g., at solder 260 (FIG. 10).

As discussed above, in an example, wherein the encapsulating mask 20 is configured to encapsulate substantially the entire circuit board 16, e.g., the front face 18, the rear face 30, and the edge 32 of the circuit board 16. In such a case, both the front face 18 and the rear face 30, and if desired the edge 32, can be surface treated, such as by applying a chemical primer or other chemical treatment to the faces 18, 30 and edge 32, or by plasma treating or flame treating the rear face 30 and edge 32 in addition to the front face 18.

After surface treating the surfaces to be encapsulated (e.g., the front face 18, and if desired, the rear face 30 and the edge 32), the encapsulating mask 20 can be formed over the circuit board 16. The encapsulating mask 20 can be adhered to the circuit board 16 and the LEDs 14 such that the LEDs 14 and any other electronic components encapsulated by the encapsulating mask 20 are substantially sealed, e.g., are substantially sealed against moisture and air.

In an example, forming the encapsulating mask 20 can comprise casting or molding the encapsulating material to form the encapsulating mask 20. Casting or molding the encapsulating mask 20 can comprise a number of steps. At 106, the circuit board 16 (which may or may not have been surface treated, as described above with respect to step 104) can be placed into a mold 34 (see, e.g., FIG. 7). The mold 34 can comprise a cavity 36 having a geometry corresponding to the desired geometry of the encapsulating mask 20. For example, the cavity 36 can include a plurality of pockets 38 that correspond to the shape of the projections 21 of the encapsulating mask 20. In an example, the circuit board 16 can be placed into the mold 34 with the front face 18 facing down so that each of the LEDs 14 can be placed into and positioned within a corresponding pocket 38. The mold 34 can also include one or more positioning structures 40 that correspond to other geometric features of the circuit board 16 to ensure that the circuit board 16 is properly aligned with the mold 34. A jig 42 can be mounted to the mold 34 to hold the circuit board 16 in the proper position and alignment, for example while the mold 34 is moved around.

Figure 7:
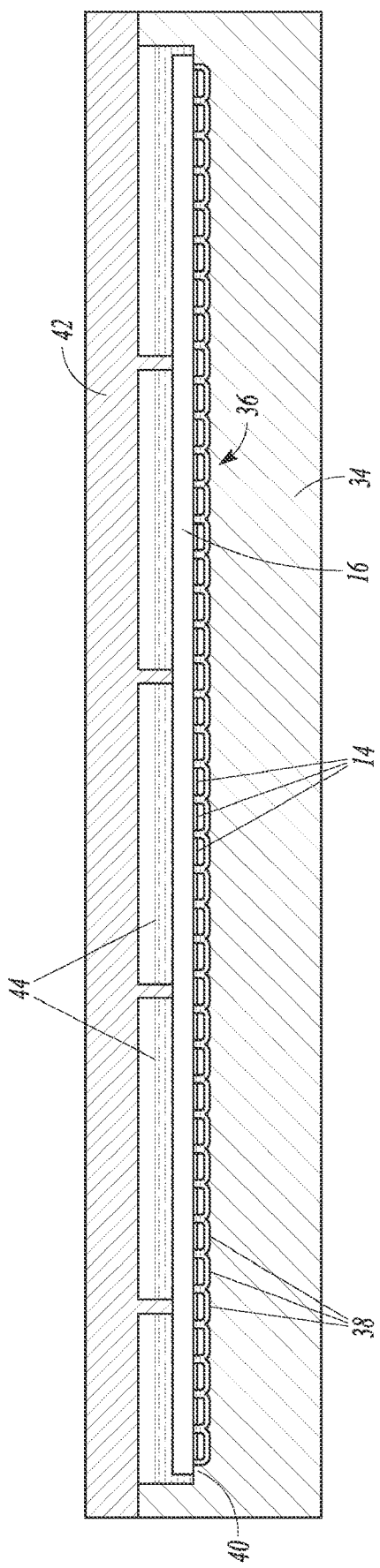
FIG. 7 is a cross sectional view of a circuit board in a mold for forming an encapsulation mask around the circuit board with an encapsulating material.

At 108, the encapsulating material 44 of the encapsulating mask 20 can be dispensed into the mold 34, as shown in FIG. 7. In an example, the encapsulating material 44 can be dispensed using a vacuum molding technique. The encapsulating material 44 can comprise a gel-like material that comprises the material of the encapsulating mask 20. In some examples, the encapsulating material 44 can comprise a silicone-based or a polyurethane-based gel that can be dispensed by any acceptable gel or liquid dispensing technique.

The mold 34 can be placed into a vacuum chamber where a vacuum pressure can be applied. In an example, the vacuum pressure in the vacuum chamber can be between about 10 torr (about 1.33 kilopascal) and about 40 torr (about 5.33 kilopascal). After the vacuum is formed in the vacuum chamber (e.g., after sufficient air has been evacuated from the vacuum chamber), the encapsulating material 44 can be dispensed into the mold 34. The application of a vacuum to the encapsulating material 44 can provide for the removal of air or other gas bubbles entrained within the encapsulating material 44. An air or gas bubble that is in front of an LED 14, e.g., within a projection 21, can distort the optics from the LED 14. Therefore, removal of air or gas bubbles from the encapsulating material 44 can, in some examples, be critical. In an example, the encapsulating material 44 can be "pre-vacuumed," e.g., the encapsulating material 44 can be subjected to a vacuum before it is dispensed into the mold 34 in order to remove a substantial portion of the air or other gas from within the encapsulating material 44. The encapsulating material 44 can be dispensed into the mold 34 until the encapsulating material 44 covers a desired portion of the circuit board 16. In an example, the encapsulating material 44 can be dispensed until it covers the entire rear face 30 or substantially the entire rear face 30. After dispensing the encapsulating material 44, the mold 34 can be allowed to flow around the circuit board 16 and to settle for a predetermined period of time. In an example, the encapsulating material 44 can be allowed to flow and settle for from about 2 seconds to about 3 minutes, such as from about 3 seconds to about 10 seconds. The mold 34 can then be removed from the vacuum chamber.

At 110, after dispensing the encapsulating material 44 into the mold 34, the encapsulating material 44 can be cured to form the substantially solidified encapsulating mask 20. In an example, the encapsulating material 44 can be a heat curable material that will cure upon the application of sufficient heat energy so that the encapsulating material 44 reaches a trigger temperature. In an example, the mold 34 with the dispensed encapsulating material 44 can be heated to the trigger temperature encapsulating material 44 with a heater. In an example, the mold 34 can be placed between a pair of heating plates. The mold 34 and the jig 42 can be compressed between the heating plates. The heating plates can then be heated to a temperature that is sufficient so that heat transferred from the heating plates through the mold 34 and the jig 42 will be sufficient for the encapsulating material 44 to reach the trigger temperature. The heat from the heating plates will heat the mold 34 and the jig 42, which can then heat the encapsulating material 44 via conduction. The heated encapsulating material 44 can begin to cure and solidify, eventually forming the encapsulating mask 20. In an example, the encapsulating material 44 can continue to cure and solidify after the mold 34 is removed from the heater. In an example, the curing of the encapsulating material 44 causes the encapsulating mask 20 to be adhered to the surfaces to be encapsulated. As described above, the surface treatment, such as chemical treatment or flame treatment, can facilitate adhesion of the encapsulating mask 20 to the circuit board 16.

At 112, after curing the encapsulating material 44 via heating, the mold 34 can optionally be cooled, such as by a cooler. In an example, the cooler can comprise a pair of cooled plates that can be similar to the heating plates of the heater, with the mold 34 and the jig 42 being compressed between the cooling plates. A cooling fluid, such as chilled water, can be circulated by or through the cooled plates. The cooler can cool the mold 34 and the cured encapsulating mask 20, such as down to room temperature.

At 114, after curing the encapsulating material 44 to form the encapsulating mask 20 and, if desired, cooling the mold 34, the encapsulated circuit board 16 can be removed from the mold 34. In an example, the encapsulated circuit board 16 can be removed by unsecuring the jig 42 from the mold 34 and lifting the encapsulated circuit board 16 from the mold 34. The used mold 34 and jig 42 can be returned to the surface treatment step where a newly treated circuit board 16 can be placed into the mold 34, secured by the jig 42, and the encapsulating material 44 dispensing process can be started again.

At 116, the video display module 10 can be assembled using the encapsulated circuit board 16. The encapsulated circuit board 16 can be aligned with a corresponding louver 24 and a corresponding housing 22. In an example, a frame (not shown) can be used to position the louver 24, the encapsulated circuit board 16, and the housing 22 with respect to each other. In an example, the louver 24 is first placed on the frame, with a front side of the louver 24 being placed down on the frame. Next, the encapsulated circuit board 16 can be placed, with the front face 18 down onto the louver 24. The circuit board 16 can comprise a plurality of louver registering openings that corresponding to a plurality of louver pegs 46 that extend rearward from the louver 24 (best seen in FIG. 2). The louver pegs 46 can be aligned with the louver registering openings in the circuit board 16 to align the louver 24 and the encapsulated circuit board 16 with respect to each other. Next, the housing 22 can be placed with a front side of the housing being placed down onto the rear face 30 of the encapsulated circuit board 16. Aligning structures on the rear face 30 of the circuit board 16 and the front side of the housing 22 can ensure alignment of the encapsulated circuit board 16 and the housing 22. Alternatively, the louver registration openings in the circuit board 16 can extend throughout the entire thickness of the circuit board 16 so that the pegs 46 can extend through the circuit board 16 and past the rear face 30. The aligning structures of the housing 22 can include a plurality of registration recesses that can each receive a portion of a corresponding louver pegs 46 so that the louver 24, the encapsulated circuit board 16, and the housing 22 can be aligned with respect to one another.

After aligning the louver 24, the encapsulated circuit board 16, and the housing 22, the components can be attached together. In an example, the louver 24 and the housing 22 can be made from a plastic or other polymeric material, so that the louver 24, encapsulated circuit board 16, and housing 22 can be welded together. As noted above, the louver registering openings in the circuit board 16 can extend through the entire thickness of the circuit board 16 so that the louver pegs 46 can extend through the circuit board 16 and contact the housing 22. The registration recesses of the housing 22 can receive the corresponding louver pegs 46. The components can then be clamped together, and the louver pegs 46 can be welded to the housing 22. In an example, a clamping apparatus can include a plurality of heating probes that are aligned with the louver pegs 46 and the registration recesses of the housing 22. When the module components are clamped together, the heating probes can be compressed against the housing 22 or the louver 24 at the locations of the louver pegs 46 and heat can be locally applied, which can heat stake the louver pegs 46 so that the louver pegs 46 become coupled with the housing 22. The louver pegs 46 can also become coupled with the encapsulated circuit board 16, such as by becoming coupled to the encapsulating mask 20. The module 10 can then be allowed to cool while still clamping the module components together so that the louver pegs 46 cool and become coupled to the housing 22 to form a module assembly.

After attaching the louver 24, the encapsulated circuit board 16, and the housing 22 together, any final components of the video display assembly 10 can be assembled, as needed. For example, electronics 48 (FIG. 5), such as power supply electronics or control electronics, can be coupled to the housing and electrically coupled to the electronics of the circuit board. A fan 50 can be coupled adjacent to the electronics and the housing 22. The electronics 48 and the fan 50 can be attached to the assembly, for example, by fastening the electronics 48 and the fan 50 to the housing 22 with fasteners, such as screws 52.

To better illustrate the apparatuses and methods disclosed herein, a non-limiting list of examples is provided here:

EXAMPLE 1 can include subject matter (such as an apparatus, a device, a method, or one or more means for performing acts), such as can include a video display module comprising a circuit board having a front face, a plurality of light-emitting elements electrically coupled to the front face of the circuit board, and a polymer encapsulating member adhered to at least the front face of the circuit board, the polymer encapsulating member substantially covering at least a portion of the circuit board and a portion of the plurality of light-emitting elements, the polymer encapsulating member substantially sealing the portion of the circuit board and the portion of the plurality of light-emitting elements.

EXAMPLE 2 can include, or can optionally be combined with the subject matter of EXAMPLE 1, to optionally include the polymer encapsulating member having a profile that substantially corresponds to a mating profile of the portion of the circuit board and the portion of the plurality of light-emitting elements.

EXAMPLE 3 can include, or can optionally be combined with the subject matter of one or any combination of EXAMPLES 1 and 2, to optionally include the front face of the circuit board being treated to promote adhesion between the polymer encapsulating member and the front face.

EXAMPLE 4 can include, or can optionally be combined with the subject matter of EXAMPLE 3, to optionally include the front face of the circuit board being treated by plasma treating the front face.

EXAMPLE 5 can include, or can optionally be combined with the subject matter of one or any combination of EXAMPLES 3 and 4, to optionally include the front face of the circuit board being treated by flame treating the front face.

EXAMPLE 6 can include, or can optionally be combined with the subject matter of one or any combination of EXAMPLES 3-5, to optionally include the front face of the circuit board being treated by applying a primer to the front face.

EXAMPLE 7 can include, or can optionally be combined with the subject matter of one or any combination of EXAMPLES 1-6, to optionally include the portion of the circuit board being treated to promote adhesion between the polymer encapsulating member and the portion of the circuit board.

EXAMPLE 8 can include, or can optionally be combined with the subject matter of EXAMPLE 7, to optionally include at least the portion of the circuit board being treated by plasma treating.

EXAMPLE 9 can include, or can optionally be combined with the subject matter of one or any combination of EXAMPLES 7 and 8, to optionally include at least the portion of the circuit board being treated by flame treating.

EXAMPLE 10 can include, or can optionally be combined with the subject matter of one or any combination of EXAMPLES 7-9, to optionally include at least the portion of the circuit board being treated by applying a primer to the portion of the circuit.

EXAMPLE 11 can include, or can optionally be combined with the subject matter of one or any combination of EXAMPLES 1-10, to optionally include the portion of the plurality of light-emitting elements being treated to promote adhesion between the polymer encapsulating member and the portion of the plurality of light-emitting elements.

EXAMPLE 12 can include, or can optionally be combined with the subject matter of EXAMPLE 11, to optionally include at least the portion of the light-emitting elements being treated by plasma treating.

EXAMPLE 13 can include, or can optionally be combined with the subject matter of one or any combination of EXAMPLES 11 and 12, to optionally include at least the portion of the light-emitting elements being treated by flame treating.

EXAMPLE 14 can include, or can optionally be combined with the subject matter of one or any combination of EXAMPLES 11-13, to optionally include at least the portion of the light-emitting elements being treated by applying a primer to the portion of the light-emitting elements.

EXAMPLE 15 can include, or can optionally be combined with the subject matter of one or any combination of EXAMPLES 1-14, to optionally include the plurality of light-emitting elements comprising surface-mounted light-emitting elements.

EXAMPLE 16 can include, or can optionally be combined with the subject matter of EXAMPLE 15, to optionally include each of the plurality of surface-mounted light-emitting elements being soldered to the circuit board with an ultraviolet light resistant solder.

EXAMPLE 17 can include, or can optionally be combined with the subject matter of one or any combination of EXAMPLES 1-16, to optionally include at least a portion of the polymer encapsulating member over each of the portion of the plurality of light-emitting elements being substantially transparent to visible light.

EXAMPLE 18 can include, or can optionally be combined with the subject matter of one or any combination of EXAMPLES 1-17, to optionally include a louver mounted over the polymer encapsulating member.

EXAMPLE 19 can include, or can optionally be combined with the subject matter of EXAMPLE 18, to optionally include the louver comprising louver blades extending from an exterior side of the louver.

EXAMPLE 20 can include, or can optionally be combined with the subject matter of EXAMPLE 19, to optionally include the louver blades extending at least partially over each of the plurality of light-emitting elements.

EXAMPLE 21 can include, or can optionally be combined with the subject matter of one or any combination of EXAMPLES 19 and 20, to optionally include the louver blades extending at least partially under each of the plurality of light-emitting elements.

EXAMPLE 22 can include, or can optionally be combined with the subject matter of one or any combination of EXAMPLES 18-21, to optionally include the louver comprising a plurality of openings.

EXAMPLE 23 can include, or can optionally be combined with the subject matter of any one of EXAMPLES 1-22, to optionally include the polymer encapsulating member comprising a plurality of light-emitting element receiving projections that extend from an exterior side of the polymer encapsulating member.

EXAMPLE 24 can include, or can optionally be combined with the subject matter of EXAMPLE 23, to optionally include each projection being configured to receive one of the plurality of light-emitting elements.

EXAMPLE 25 can include, or can optionally be combined with the subject matter of one or any combination of EXAMPLES 22 and 24, to optionally include each light-emitting element receiving projection extending at least partially into one of the plurality of openings in the louver.

EXAMPLE 26 can include, or can optionally be combined with the subject matter of one or any combination of EXAMPLES 1-25, to optionally include the circuit board comprising a rear face opposing the front face.

EXAMPLE 27 can include, or can optionally be combined with the subject matter of EXAMPLE 26, to optionally include the polymer encapsulating member covering substantially all of the front face.

EXAMPLE 28 can include, or can optionally be combined with the subject matter of one or any combination of EXAMPLES 26 and 27, to optionally include the polymer encapsulating member covering substantially all of the rear face.

EXAMPLE 29 can include, or can optionally be combined with the subject matter of one or any combination of EXAMPLES 26-28, to optionally include the rear face of the circuit board being treated to promote adhesion between the polymer encapsulating member and the rear face.

EXAMPLE 30 can include, or can optionally be combined with the subject matter of EXAMPLE 29, to optionally include the rear face of the circuit board being treated by plasma treating the rear face.

EXAMPLE 31 can include, or can optionally be combined with the subject matter of one or any combination of EXAMPLES 29 and 30, to optionally include the rear face of the circuit board being treated by flame treating the rear face.

EXAMPLE 32 can include, or can optionally be combined with the subject matter of one or any combination of EXAMPLES 29-31, to optionally include the rear face of the circuit board being treated by applying a primer to the rear face.

EXAMPLE 33 can include, or can optionally be combined with the subject matter of one or any combination of EXAMPLES 1-32, to optionally include the circuit board comprising an edge along one or more sides extending rearward from the front face.

EXAMPLE 34 can include, or can optionally be combined with the subject matter of EXAMPLE 33, to optionally include the polymer encapsulating member covering substantially all of the edge.

EXAMPLE 35 can include, or can optionally be combined with the subject matter of one or any combination of EXAMPLES 33 and 34, to optionally include the edge of the circuit board being treated to promote adhesion between the polymer encapsulating member and the edge.

EXAMPLE 36 can include, or can optionally be combined with the subject matter of EXAMPLE 35, to optionally include the edge of the circuit board being treated by plasma treating the edge.

EXAMPLE 37 can include, or can optionally be combined with the subject matter of one or any combination of EXAMPLES 35 and 36, to optionally include the edge of the circuit board being treated by flame treating the edge.

EXAMPLE 38 can include, or can optionally be combined with the subject matter of one or any combination of EXAMPLES 35-37, to optionally include the edge of the circuit board being treated by applying a primer to the edge.

EXAMPLE 39 can include, or can optionally be combined with the subject matter of one or any combination of EXAMPLES 1-38, to optionally include the polymer encapsulating member comprising a silicone or polyurethane material.

EXAMPLE 40 can include, or can optionally be combined with the subject matter of one or any combination of EXAMPLES 1-39, to include subject matter (such as an apparatus, a device, a method, or one or more means for performing acts), such as can include a video display module comprising a circuit board having a front face, a plurality of light-emitting elements electrically coupled to the front face of the circuit board, and a polymer encapsulating member adhered to the front face of the circuit board, the polymer encapsulating member substantially covering at least a portion of the circuit board and a portion of the plurality of light-emitting elements, wherein the polymer encapsulating member is shaped over each of the portion of the plurality of light-emitting elements to form a lens over each of the portion of the plurality of light-emitting elements.

EXAMPLE 41 can include, or can optionally be combined with the subject matter of EXAMPLE 40, to optionally include the shape of each lens over each of the portion of the plurality of light-emitting elements being configured to provide for a predetermined viewing angle of each of the portion of the plurality of light-emitting elements.

EXAMPLE 42 can include, or can optionally be combined with the subject matter of one or any combination of EXAMPLES 40 and 41, to optionally include the polymer encapsulating member substantially sealing the portion of the circuit board.

EXAMPLE 43 can include, or can optionally be combined with the subject matter of one or any combination of EXAMPLES 40-42, to optionally include the polymer encapsulating member substantially sealing the portion of the plurality of light-emitting elements.

EXAMPLE 44 can include, or can optionally be combined with the subject matter of one or any combination of EXAMPLES 40-43, to optionally include the front face of the circuit board being treated to promote adhesion between the polymer encapsulating member and the front face.

EXAMPLE 45 can include, or can optionally be combined with the subject matter of EXAMPLE 44, to optionally include the front face of the circuit board being treated by plasma treating the front face.

EXAMPLE 46 can include, or can optionally be combined with the subject matter of one or any combination of EXAMPLES 44 and 45, to optionally include the front face of the circuit board being treated by flame treating the front face.

EXAMPLE 47 can include, or can optionally be combined with the subject matter of one or any combination of EXAMPLES 44-46, to optionally include the front face of the circuit board being treated by applying a primer to the front face.

EXAMPLE 48 can include, or can optionally be combined with the subject matter of one or any combination of EXAMPLES 40-47, to optionally include the portion of the circuit board being treated to promote adhesion between the polymer encapsulating member and the portion of the circuit board.

EXAMPLE 49 can include, or can optionally be combined with the subject matter of EXAMPLE 48, to optionally include at least the portion of the circuit board being treated by plasma treating.

EXAMPLE 50 can include, or can optionally be combined with the subject matter of one or any combination of EXAMPLES 48 and 49, to optionally include at least the portion of the circuit board being treated by flame treating.

EXAMPLE 51 can include, or can optionally be combined with the subject matter of one or any combination of EXAMPLES 48-50, to optionally include at least the portion of the circuit board being treated by applying a primer to the portion of the circuit.

EXAMPLE 52 can include, or can optionally be combined with the subject matter of one or any combination of EXAMPLES 40-51, to optionally include the portion of the plurality of light-emitting elements being treated to promote adhesion between the polymer encapsulating member and the portion of the plurality of light-emitting elements.

EXAMPLE 53 can include, or can optionally be combined with the subject matter of EXAMPLE 52, to optionally include at least the portion of the light-emitting elements being treated by plasma treating.

EXAMPLE 54 can include, or can optionally be combined with the subject matter of one or any combination of EXAMPLES 52 and 53, to optionally include at least the portion of the light-emitting elements being treated by flame treating.

EXAMPLE 55 can include, or can optionally be combined with the subject matter of one or any combination of EXAMPLES 52-54, to optionally include at least the portion of the light-emitting elements being treated by applying a primer to the portion of the light-emitting elements.

EXAMPLE 56 can include, or can optionally be combined with the subject matter of one or any combination of EXAMPLES 40-55, to optionally include the plurality of light-emitting elements comprising surface-mounted light-emitting elements.

EXAMPLE 57 can include, or can optionally be combined with the subject matter of EXAMPLE 56, to optionally include each of the plurality of surface-mounted light-emitting elements are soldered to the circuit board with an ultraviolet light resistant solder.

EXAMPLE 58 can include, or can optionally be combined with the subject matter of one or any combination of EXAMPLES 40-57, to optionally include a louver mounted over the polymer encapsulating member.

EXAMPLE 59 can include, or can optionally be combined with the subject matter of EXAMPLE 58, to optionally include the louver comprising louver blades extending from an exterior side of the louver.

EXAMPLE 60 can include, or can optionally be combined with the subject matter of EXAMPLE 59, to optionally include the louver blades extending at least partially over each of the plurality of light-emitting elements.

EXAMPLE 61 can include, or can optionally be combined with the subject matter of one or any combination of EXAMPLES 59 and 60, to optionally include the louver blades extending at least partially under each of the plurality of light-emitting elements.

EXAMPLE 62 can include, or can optionally be combined with the subject matter of one or any combination of EXAMPLES 58-61, to optionally include the louver comprising a plurality of openings.

EXAMPLE 63 can include, or can optionally be combined with the subject matter of any one of EXAMPLES 40-63, to optionally include the polymer encapsulating member comprising a plurality of light-emitting element receiving projections that extend from an exterior side of the polymer encapsulating member.

EXAMPLE 64 can include, or can optionally be combined with the subject matter of EXAMPLE 63, to optionally include each projection being configured to receive one of the plurality of light-emitting elements.

EXAMPLE 65 can include, or can optionally be combined with the subject matter of one or any combination of EXAMPLES 62 and 64, to optionally include each light-emitting element receiving projection extending at least partially into one of the plurality of openings in the louver.

EXAMPLE 66 can include, or can optionally be combined with the subject matter of any one of EXAMPLES 40-65, to optionally include the circuit board comprising a rear face opposing the front face.

EXAMPLE 67 can include, or can optionally be combined with the subject matter of EXAMPLE 66, to optionally include the polymer encapsulating member covering substantially all of the front face.

EXAMPLE 68 can include, or can optionally be combined with the subject matter of one or any combination of EXAMPLES 66 and 67, to optionally include the polymer encapsulating member covering substantially all of the rear face.

EXAMPLE 69 can include, or can optionally be combined with the subject matter of one or any combination of EXAMPLES 66-68, to optionally include the rear face of the circuit board being treated to promote adhesion between the polymer encapsulating member and the rear face.

EXAMPLE 70 can include, or can optionally be combined with the subject matter of EXAMPLE 69, to optionally include the rear face of the circuit board being treated by plasma treating the rear face.

EXAMPLE 71 can include, or can optionally be combined with the subject matter of one or any combination of EXAMPLES 69 and 70, to optionally include the rear face of the circuit board being treated by flame treating the rear face.

EXAMPLE 72 can include, or can optionally be combined with the subject matter of one or any combination of EXAMPLES 69-71, to optionally include the rear face of the circuit board being treated by applying a primer to the rear face.

EXAMPLE 73 can include, or can optionally be combined with the subject matter of one or any combination of EXAMPLES 40-72, to optionally include the circuit board comprising an edge along one or more sides extending from the front face.

EXAMPLE 74 can include, or can optionally be combined with the subject matter of EXAMPLE 73, to optionally include the polymer encapsulating member covering substantially all of the edge.

EXAMPLE 75 can include, or can optionally be combined with the subject matter of one or any combination of EXAMPLES 73 and 74, to optionally include the edge of the circuit board being treated to promote adhesion between the polymer encapsulating member and the edge.

EXAMPLE 76 can include, or can optionally be combined with the subject matter of EXAMPLE 75, to optionally include the edge of the circuit board being treated by plasma treating the edge.

EXAMPLE 77 can include, or can optionally be combined with the subject matter of one or any combination of EXAMPLES 75 and 76, to optionally include the edge of the circuit board being treated by flame treating the edge.

EXAMPLE 78 can include, or can optionally be combined with the subject matter of one or any combination of EXAMPLES 75-77, to optionally include the edge of the circuit board being treated by applying a primer to the edge.

EXAMPLE 79 can include, or can optionally be combined with the subject matter of any one of EXAMPLES 40-78, to optionally include the polymer encapsulating member comprising a silicone material.

EXAMPLE 80 can include, or can optionally be combined with the subject matter of any one of EXAMPLES 40-79, to optionally include the polymer encapsulating member comprising a polyurethane material.

EXAMPLE 81 can include, or can optionally be combined with the subject matter of one or any combination of EXAMPLES 1-80, to include subject matter (such as an apparatus, a device, a method, or one or more means for performing acts), such as can include a method of manufacturing a video display module, the method comprising providing or receiving a circuit board comprising a plurality of light-emitting elements mounted to a front face of the circuit board, forming a polymer encapsulating member over at least a portion of the front face of the circuit board and at least a portion of the plurality of light-emitting elements, adhering the polymer encapsulating member to the front face of the circuit board, and sealing at least the portion of the front face of the circuit board and the portion of the plurality of light-emitting elements with the polymer encapsulating member.

EXAMPLE 82 can include, or can optionally be combined with the subject matter of EXAMPLE 81, to optionally include the providing the circuit board comprising mounting the plurality of light-emitting elements to the front face of the circuit board.

EXAMPLE 83 can include, or can optionally be combined with the subject matter of any one of EXAMPLES 81 and 82, to optionally include forming the polymer encapsulating member with a profile that substantially corresponds to a mating profile of the portion of the front face of the circuit board and the portion of the plurality of light-emitting elements.

EXAMPLE 84 can include, or can optionally be combined with the subject matter of any one of EXAMPLES 81-83, to optionally include molding a polymer material to form the polymer encapsulation member.

EXAMPLE 85 can include, or can optionally be combined with the subject matter of EXAMPLE 84, to optionally include molding the polymer material over at least the portion of the front face of the circuit board.

EXAMPLE 86 can include, or can optionally be combined with the subject matter of any one of EXAMPLES 84 and 85, to optionally include molding the polymer material over at least the portion of the plurality of light-emitting elements.

EXAMPLE 87 can include, or can optionally be combined with the subject matter of any one of EXAMPLE 81-86, to optionally include casting a polymer material to form the polymer encapsulation member.

EXAMPLE 88 can include, or can optionally be combined with the subject matter of EXAMPLE 87, to optionally include casting the polymer material over at least the portion of the front face of the circuit board.

EXAMPLE 89 can include, or can optionally be combined with the subject matter of any one of EXAMPLES 87 and 88, to optionally include casting the polymer material over at least the portion of the plurality of light-emitting elements.

EXAMPLE 90 can include, or can optionally be combined with the subject matter of any one of EXAMPLES 84-89, to optionally include the polymer material comprising a polyurethane.

EXAMPLE 91 can include, or can optionally be combined with the subject matter of any one of EXAMPLEs 84-90, to optionally include the polymer material comprising a silicone.

EXAMPLE 92 can include, or can optionally be combined with the subject matter of any one of EXAMPLES 81-91, to optionally include treating at least the portion of the front face of the circuit board to promote adhesion between the polymer encapsulating member and the portion of the front face of the circuit board.

EXAMPLE 93 can include, or can optionally be combined with the subject matter of EXAMPLE 92, to optionally include the treating comprising plasma treating at least the portion of the front face of the circuit board.

EXAMPLE 94 can include, or can optionally be combined with the subject matter of any one of EXAMPLES 92 and 93, to optionally include the treating comprising flame treating at least the portion of the front face of the circuit board.

EXAMPLE 95 can include, or can optionally be combined with the subject matter of any one of EXAMPLES 92-94, to optionally include the treating comprising applying a primer to at least the portion of the front face of the circuit board.

EXAMPLE 96 can include, or can optionally be combined with the subject matter of any one of EXAMPLES 81-95, to optionally include treating at least the portion of the plurality of light-emitting elements to promote adhesion between the polymer encapsulating member and the portion of the plurality of light-emitting elements.

EXAMPLE 97 can include, or can optionally be combined with the subject matter of EXAMPLE 96, to optionally include the treating comprising plasma treating at least the portion of the plurality of light-emitting elements.

EXAMPLE 98 can include, or can optionally be combined with the subject matter of any one of EXAMPLES 96 and 97, to optionally include the treating comprising flame treating at least the portion of the plurality of light-emitting elements.

EXAMPLE 99 can include, or can optionally be combined with the subject matter of any one of EXAMPLES 96-98, to optionally include the treating comprising applying a primer to at least the portion of the plurality of light-emitting elements.

EXAMPLE 100 can include, or can optionally be combined with the subject matter of any one of EXAMPLES 81-99, to optionally include the circuit board comprising a rear face opposing the front face.

EXAMPLE 101 can include, or can optionally be combined with the subject matter of EXAMPLE 100, to optionally include forming the polymer encapsulating member to cover substantially all of the front face.

EXAMPLE 102 can include, or can optionally be combined with the subject matter of one or any combination of EXAMPLES 100 and 101, to optionally include forming the polymer encapsulating member to cover substantially all of the rear face.

EXAMPLE 103 can include, or can optionally be combined with the subject matter of one or any combination of EXAMPLES 100-102, to optionally include treating at least the rear face of the circuit board to promote adhesion between the polymer encapsulating member and the rear face.

EXAMPLE 104 can include, or can optionally be combined with the subject matter of EXAMPLE 103, to optionally include the treating comprising plasma treating at least the rear face of the circuit board.

EXAMPLE 105 can include, or can optionally be combined with the subject matter of one or any combination of EXAMPLES 103 and 104, to optionally include the treating comprising flame treating at least the rear face of the circuit board.

EXAMPLE 106 can include, or can optionally be combined with the subject matter of one or any combination of EXAMPLES 103-105, to optionally include the treating comprising applying a primer to at least the rear face of the circuit board.

EXAMPLE 107 can include, or can optionally be combined with the subject matter of one or any combination of EXAMPLES 40-72, to optionally include the circuit board comprising an edge along one or more sides extending from the front face.

EXAMPLE 108 can include, or can optionally be combined with the subject matter of EXAMPLE 107, to optionally include forming the polymer encapsulating member to cover substantially all of the edge.

EXAMPLE 109 can include, or can optionally be combined with the subject matter of one or any combination of EXAMPLES 107 and 108, to optionally include treating at least the edge of the circuit board to promote adhesion between the polymer encapsulating member and the edge.

EXAMPLE 110 can include, or can optionally be combined with the subject matter of EXAMPLE 109, to optionally include the treating comprising plasma treating at least the edge of the circuit board.

EXAMPLE 111 can include, or can optionally be combined with the subject matter of one or any combination of EXAMPLES 109 and 110, to optionally include the treating comprising flame treating at least the edge of the circuit board.

EXAMPLE 112 can include, or can optionally be combined with the subject matter of one or any combination of EXAMPLES 109-111, to optionally include the treating comprising applying a primer to at least the edge of the circuit board.

EXAMPLE 113 can include, or can optionally be combined with the subject matter of any one of EXAMPLES 81-112, to optionally include the polymer encapsulating member comprising a silicone material.

EXAMPLE 114 can include, or can optionally be combined with the subject matter of any one of EXAMPLES 81-113, to optionally include the polymer encapsulating member comprising a polyurethane material.

EXAMPLE 115 can include subject matter (such as an apparatus, a device, a method, or one or more means for performing acts), such as can include a display module comprising a circuit board having a front face, a plurality of light-emitting elements electrically coupled to the front face of the circuit board, a polymer encapsulating member adhered to at least the front face of the circuit board, the polymer encapsulating member substantially covering at least a portion of the circuit board and a portion of the plurality of light-emitting elements, the polymer encapsulating member substantially sealing the portion of the circuit board and the portion of the plurality of light-emitting elements, and an ultraviolet-radiation diminishing component in the polymer encapsulating member or on one or more of the circuit board or at least a portion of each of the light-emitting elements, wherein the ultraviolet-radiation diminishing component filters, blocks, or reflects more ultraviolet radiation than would be filtered, blocked, or reflected by the polymer encapsulating member without the ultraviolet-radiation diminishing component.

EXAMPLE 116 can include, or can optionally be combined with the subject matter of Example 115, to optionally include the polymer encapsulating member having the base material and the ultraviolet-radiation diminishing component include an additive added to the base material that causes the encapsulating member to filter, block, or reflect more ultraviolet radiation than would be filtered, blocked, or reflected by the base material alone.

EXAMPLE 117 can include, or can optionally be combined with the subject matter of one or any combination of EXAMPLES 115 and 116, to optionally include the base material where the base material comprises at least one of a silicone, a polyurethane, a nylon, and a polycarbonate.

EXAMPLE 118 can include, or can optionally be combined with the subject matter of one or any combination of EXAMPLES 115-117, to optionally include the base material wherein the base material comprises polydimethylsiloxane and the additive comprises at least one of benzophenone, benzotriazole, or octylmethoxy cinnamate, or the base material comprises nylon and the additive comprises an oxanilide, or the base material comprises polycarbonate and the additive comprises a benzotriazole.

EXAMPLE 119 can include, or can optionally be combined with the subject matter of one or any combination of EXAMPLES 115-118, to optionally include the ultraviolet-radiation diminishing component includes an ultraviolet-radiation filtering or ultraviolet-radiation blocking coating applied to one or more of the front face of the circuit board or at least a portion of each of the plurality of light-emitting elements, wherein the ultraviolet-radiation filtering or ultraviolet-radiation blocking coating comprises carbon black and a carbon black pigment.

EXAMPLE 120 can include, or can optionally be combined with the subject matter of one or any combination of EXAMPLES 115-119, to optionally include the polymer encapsulating member that has a profile that substantially corresponds to a mating profile of the portion of the circuit board and the portion of the plurality of light-emitting elements.

EXAMPLE 121 can include, or can optionally be combined with the subject matter of one or any combination of EXAMPLES 115-120, wherein the portion of the circuit board and the portion of the plurality of light-emitting elements is treated to promote adhesion between the polymer encapsulating member and the portion of the circuit board and the portion of the plurality of light-emitting elements.

EXAMPLE 122 can include, or can optionally be combined with the subject matter of one or any combination of EXAMPLES 115-121, wherein at least the portion of the circuit board and the portion of the plurality of light-emitting elements is treated by at least one of plasma treating the portion of the circuit board and the portion of the plurality of light-emitting elements; flame treating the portion of the circuit board and the portion of the plurality of light-emitting elements; exposing the portion of the circuit board and the portion of the plurality of light-emitting elements to an ultraviolet ionizing radiation in the presence of oxygen gas; or applying a primer to the portion of the circuit board and the portion of the plurality of light-emitting elements.

EXAMPLE 123 can include, or can optionally be combined with the subject matter of one or any combination of EXAMPLES 115-122, wherein the plurality of light-emitting elements comprises surface-mounted light-emitting elements that are soldered to the circuit board with solder.

EXAMPLE 124 can include, or can optionally be combined with the subject matter of one or any combination of EXAMPLES 115-123, wherein at least a portion of the polymer encapsulating member over each of the portion of the plurality of light-emitting elements is substantially transparent to visible light.

EXAMPLE 125 can include, or can optionally be combined with the subject matter of one or any combination of EXAMPLES 115-124, optionally including a louver mounted over the polymer encapsulating member, the louver comprising a plurality of openings, wherein the polymer encapsulating member comprises a plurality of light-emitting element receiving projections that extend from an exterior side of the polymer encapsulating member, each projection being configured to receive one of the plurality of light-emitting elements, wherein each light-emitting element receiving projection extends at least partially into one of the plurality of openings in the louver.

EXAMPLE 126 can include, or can optionally be combined with the subject matter of one or any combination of EXAMPLES 115-125, wherein the circuit board comprises a rear face opposing the front face and an edge along one or more sides extending rearward from the front face toward the rear face, wherein the polymer encapsulating member is adhered to substantially all of the front face, substantially all of the edge, and at least a portion of the rear face.

EXAMPLE 127 can include, or can optionally be combined with the subject matter of one or any combination of EXAMPLES 115-126, wherein the front face, the edge, and the rear face of the circuit board are treated to promote adhesion between the polymer encapsulating member and the front face and the rear face.

EXAMPLE 128 can include, or can optionally be combined with the subject matter of one or any combination of EXAMPLES 115-127, wherein the front face, the edge, and the rear face of the circuit board are treated by at least one of plasma treating, flame treating, exposure to an ultraviolet ionizing radiation source in the presence of oxygen gas, and applying a primer thereto.

EXAMPLE 129 can include, or can optionally be combined with the subject matter of one or any combination of EXAMPLES 115-128, wherein the polymer encapsulating member comprises a silicone or polyurethane material.

EXAMPLE 130 can include subject matter (such as an apparatus, a device, a method, or one or more means for performing acts), such as can include a display module comprising a circuit board having a front face, a plurality of light-emitting elements electrically coupled to the front face of the circuit board, one or more electronic components electrically coupled to the front face of the circuit board, and a polymer encapsulating member adhered to the front face of the circuit board, the polymer encapsulating member substantially covering at least a portion of the circuit board, at least a portion of the one or more electronic components, and at least a portion of the plurality of light-emitting elements wherein the polymer encapsulating member filters, blocks, or reflects sufficient ultraviolet radiation so that the circuit board, the electronic components, and the light-emitting elements will have a lifetime of at least seven years of outdoor exposure.

EXAMPLE 131 can include, or can optionally be combined with the subject matter of EXAMPLE 130, wherein the shape of each lens over each of the portion of the plurality of light-emitting elements is configured to provide for a predetermined viewing angle of each of the portion of the plurality of light-emitting elements.

EXAMPLE 132 can include, or can optionally be combined with the subject matter of one or any combination of EXAMPLE 130 and EXAMPLE 131, wherein the polymer encapsulating member substantially seals the portion of the circuit board and the portion of the plurality of light-emitting elements.

EXAMPLE 133 can include, or can optionally be combined with the subject matter of one or any combination of EXAMPLES 130-132, wherein the polymer encapsulating member comprises a mixture of a base material and an additive, wherein the additive causes the encapsulating member to filter, block, or reflect more ultraviolet radiation than would be filtered, blocked, or reflected by the base material alone.

EXAMPLE 134 can include, or can optionally be combined with the subject matter of one or any combination of EXAMPLE 130-133, wherein the base material comprises at least one of: a silicone, a urethane, a nylon, or a polycarbonate.

EXAMPLE 135 can include, or can optionally be combined with the subject matter of one or any combination of EXAMPLE 130-134, to optionally include the base material wherein the base material comprises polydimethylsiloxane and the additive comprises at least one of benzophenone, benzotriazole, or octylmethoxy cinnamate, or the base material comprises nylon and the additive comprises an oxanilide, or the base material comprises polycarbonate and the additive comprises a benzotriazole.

EXAMPLE 136 can include, or can optionally be combined with the subject matter of one or any combination of EXAMPLE 130-135, wherein at least the portion of the circuit board, the portion of the one or more electronic components, and the portion of the plurality of light-emitting elements are treated to promote adhesion between the polymer encapsulating member and the portion of the circuit board, the portion of the one or more electronic components, and the portion of the plurality of light-emitting elements.

EXAMPLE 137 can include, or can optionally be combined with the subject matter of one or any combination of EXAMPLE 130-136, wherein at least the portion of the circuit board and the portion of the plurality of light-emitting elements is treated by at least one of: plasma treating, flame treating, exposure to an ultraviolet ionizing radiation in the presence of oxygen gas, or applying a primer thereto.

EXAMPLE 138 can include, or can optionally be combined with the subject matter of one or any combination of EXAMPLE 130-137, wherein the circuit board comprises a rear face opposing the front face and an edge along one or more sides extending rearward from the front face toward the rear face, wherein the polymer encapsulating member is adhered to substantially all of the front face, substantially all of the edge, and at least a portion of the rear face.

EXAMPLE 139 can include, or can optionally be combined with the subject matter of one or any combination of EXAMPLE 130-138, wherein the portion of the circuit board and the portion of the plurality of light-emitting elements, front face, the edge, and the rear face of the circuit board are treated to promote bonding adhesion between the polymer encapsulating member and the portion of the circuit board and the portion of the plurality of light-emitting elements front face and the rear face.

EXAMPLE 140 can include, or can optionally be combined with the subject matter of one or any combination of EXAMPLE 130-139, wherein the portion of the circuit board and the portion of the plurality of light-emitting elements, front face, the edge, and the rear face of the circuit board are treated by at least one of plasma treating, flame treating, UVO treating, exposing the portion of the circuit board and the portion of the plurality of light-emitting elements to an ultraviolet ionizing radiation source in the presence of oxygen gas, and applying a primer thereto.

EXAMPLE 141 can include, or can optionally be combined with the subject matter of one or any combination of EXAMPLE 130-140, to optionally include solder electrically connecting the circuit board to at least one of: the one or more electrical components, or the plurality of light-emitting elements, wherein the polymer encapsulating member filters, blocks, or reflects sufficient ultraviolet radiation so that the solder will have a lifetime of at least seven years of outdoor exposure.

EXAMPLE 142 can include, or can optionally be combined with the subject matter of one or any combination of EXAMPLE 130-141, wherein the polymer encapsulating member comprises a silicone or polyurethane material.

EXAMPLE 143 can include subject matter (such as an apparatus, a device, a method, or one or more means for performing acts), such as can include a method of manufacturing a display module, comprising providing or receiving a circuit board comprising a plurality of light-emitting elements mounted to a face of the circuit board, implementing a UV filter including at least one of combining an additive with a polymer encapsulating member and applying a blocking coating to the circuit board, forming a polymer encapsulating member over at least a portion of the face of the circuit board and at least a portion of the plurality of light-emitting elements, adhering the polymer encapsulating member to the face of the circuit board, and sealing at least the portion of the face of the circuit board and the portion of the plurality of light-emitting elements with the polymer encapsulating member.

EXAMPLE 144 can include, or can optionally be combined with the subject matter of EXAMPLE 143, further comprising forming the polymer encapsulating member with a profile that substantially corresponds to a mating profile of the portion of the face of the circuit board and the portion of the plurality of light-emitting elements.

EXAMPLE 145 can include, or can optionally be combined with the subject matter of one or any combination of EXAMPLE 143 and 144, wherein forming the polymer encapsulation member comprises molding or casting a polymer material comprising at least one of polyurethane or silicone over at least the portion of the face of the circuit board and the portion of the plurality of light-emitting elements.

EXAMPLE 146 can include, or can optionally be combined with the subject matter of one or any combination of EXAMPLE 143-145, further comprising treating at least one of the portion of the face of the circuit board and the portion of the plurality of light-emitting elements to promote chemical bonding between the polymer encapsulating member and the portion of the face of the circuit board or the portion of the plurality of light-emitting elements.

EXAMPLE 147 can include, or can optionally be combined with the subject matter of one or any combination of EXAMPLE 143-146, wherein the treating comprises at least one of plasma treating, flame treating, UVO treating, or applying a primer thereto.

EXAMPLE 148 can include subject matter (such as an apparatus, a device, a method, or one or more means for performing acts), such as can include a display module comprising a circuit board having a front face, a plurality of light-emitting elements electrically coupled to the front face of the circuit board, one or more electronic components electrically coupled to the front face of the circuit board, an ultraviolet-radiation filtering or blocking coating applied over at least a portion of the circuit board and at least a portion of the one or more electronic components; and a polymer encapsulating member adhered to the front face of the circuit board, the polymer encapsulating member substantially covering at least a portion of the circuit board, at least a portion of the one or more electronic components, at least a portion of the ultraviolet-radiation filtering or blocking coating, and at least a portion of the plurality of light-emitting elements.

EXAMPLE 149 can include, or can optionally be combined with the subject matter of EXAMPLE 148, wherein the ultraviolet-radiation filtering or blocking coating allows the circuit board and the one or more electronic components to have a lifetime of at least seven years of outdoor exposure.

EXAMPLE 150 can include, or can optionally be combined with the subject matter of one or any combination of EXAMPLE 148 and 149, to optionally include solder electrically coupling the circuit board to at least one of the one or more electronic components or the plurality of light-emitting elements, wherein the ultraviolet-radiation filtering or blocking coating is also applied over at least a portion of the solder.

EXAMPLE 151 can include, or can optionally be combined with the subject matter of one or any combination of EXAMPLE 148-150, wherein at least the portion of the circuit board, the portion of the one or more electronic components, the portion of the ultraviolet-radiation filtering or blocking coating, and the portion of the plurality of light-emitting elements are treated by at least one of plasma treating, flame treating, exposure to an ultraviolet ionizing radiation in the presence of oxygen gas; or applying a primer thereto EXAMPLE 152 can include, or can optionally be combined with the subject matter of one or any combination of EXAMPLE 148-151, wherein the circuit board comprises a rear face opposing the front face and an edge along one or more sides extending rearward from the front face toward the rear face, wherein the polymer encapsulating member is adhered to substantially all of the front face, substantially all of the edge, and at least a portion of the rear face.

The above Detailed Description is intended to be illustrative, and not restrictive. For example, the above-described examples (or one or more elements thereof) can be used in combination with each other. Other embodiments can be used, such as by one of ordinary skill in the art upon reviewing the above description. Also, various features or elements can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented, at least in part. Some examples can include a computer-readable medium or machine-readable medium encoded with instructions operable to configure an electronic device to perform methods or method steps as described in the above examples. An implementation of such methods or method steps can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The Abstract is provided to comply with 37 C.F.R. § 1.72(b), to allow the reader to quickly ascertain the nature of the technical disclosure. It is submitted with the understanding that it will not be used to interpret or limit the scope or meaning of the claims.

What is claimed is:

1. A display module comprising:
   a circuit board having a front face and a plurality of electrical connection pads at the front face;
   a plurality of light-emitting elements each electrically mounted to one or more of the plurality of electrical connection pads, wherein the plurality of light-emitting elements is arranged in an array of pixels configured to display at least one of video, graphical, or textual information; and
   a polymer encapsulating member adhered to at least the front face of the circuit board, the polymer encapsulating member substantially covering at least a portion of the circuit board, at least a portion of the plurality of electrical connection pads, and at least a portion of the array of pixels of light-emitting elements, the polymer encapsulating member substantially sealing the portion of the circuit board, the portion of the plurality of electrical connection pads, and the portion of the array of pixels of light-emitting elements.

2. The display module of claim 1, wherein one or more of the portion of the circuit board, the portion of the plurality of electrical connection pads, and the portion of the array of pixels of light-emitting elements is treated to promote adhesion between the polymer encapsulating member and the portion of the circuit board and the portion of the array of pixels of light-emitting elements.

3. The display module of claim 2, wherein one or more of the portion of the circuit board, the portion of the plurality of electrical connection pads, and the portion of the array of pixels of light-emitting elements is treated by at least one of plasma treating one or more of the portion of the circuit board, the portion of the plurality of electrical connection pads, and the portion of the array of pixels of light-emitting elements; flame treating one or more of the portion of the circuit board, the portion of the plurality of electrical connection pads, and the portion of the array of pixels of light-emitting elements; and applying a primer to one or more of the portion of the circuit board, the portion of the plurality of electrical connection pads, and the portion of the array of pixels of light-emitting elements.

4. The display module of claim 1, wherein at least a portion of the polymer encapsulating member covering the portion of the array of pixels of light-emitting elements is substantially transparent to visible light.

5. A display module comprising:
a circuit board having a front face and a plurality of electrical connection pads at the front face;
a plurality of light-emitting elements each electrically mounted to one or more of the plurality of electrical connection pads;
a polymer encapsulating member adhered to at least the front face of the circuit board, the polymer encapsulating member substantially covering at least a portion of the circuit board, at least a portion of the plurality of electrical connection pads, and a portion of the plurality of light-emitting elements, the polymer encapsulating member substantially sealing the portion of the circuit board, the portion of the plurality of electrical connection pads, and the portion of the plurality of light-emitting elements; and
a louver mounted over the polymer encapsulating member, the louver comprising a plurality of openings, wherein the polymer encapsulating member comprises a plurality of light-emitting element receiving projections that extend from an exterior side of the polymer encapsulating member, each projection being configured to receive one or more of the plurality of light-emitting elements, wherein each light-emitting element receiving projection extends at least partially into one of the plurality of openings in the louver.

6. The display module of claim 1, wherein the circuit board comprises a rear face opposing the front face and an edge along one or more sides extending rearward from the front face toward the rear face, wherein the polymer encapsulating member is adhered to substantially all of the front face, substantially all of the edge, and substantially all of the rear face.

7. The display module of claim 6, wherein the front face, the edge, and the rear face of the circuit board are treated to promote adhesion between the polymer encapsulating member and the front face and the rear face.

8. The display module of claim 7, wherein the front face, the edge, and the rear face of the circuit board are treated by at least one of plasma treating, flame treating, and applying a primer.

9. The display module of claim 1, wherein the polymer encapsulating member comprises a silicone or polyurethane material.

10. The display module of claim 1, wherein each of the plurality of light-emitting elements are mounted directly to the one or more of the plurality of electrical connection pads.

11. The display module of claim 5, wherein one or more of the portion of the circuit board, the portion of the plurality of electrical connection pads, and the portion of the plurality of light-emitting elements is treated to promote adhesion between the polymer encapsulating member and the portion of the circuit board and the portion of the plurality of light-emitting elements.

12. The display module of claim 11, wherein one or more of the portion of the circuit board, the portion of the plurality of electrical connection pads, and the portion of the plurality of light-emitting elements is treated by at least one of plasma treating one or more of the portion of the circuit board, the portion of the plurality of electrical connection pads, and the portion of the plurality of light-emitting elements; flame treating one or more of the portion of the circuit board, the portion of the plurality of electrical connection pads, and the portion of the plurality of light-emitting elements; and applying a primer to one or more of the portion of the circuit board, the portion of the plurality of electrical connection pads, and the portion of the plurality of light-emitting elements.

13. The display module of claim 5, wherein at least a portion of the polymer encapsulating member covering each of the portion of the plurality of light-emitting elements is substantially transparent to visible light.

14. The display module of claim 5, wherein the circuit board comprises a rear face opposing the front face and an edge along one or more sides extending rearward from the front face toward the rear face, wherein the polymer encapsulating member is adhered to substantially all of the front face, substantially all of the edge, and substantially all of the rear face.

15. The display module of claim 14, wherein the front face, the edge, and the rear face of the circuit board are treated to promote adhesion between the polymer encapsulating member and the front face and the rear face.

16. The display module of claim 15, wherein the front face, the edge, and the rear face of the circuit board are treated by at least one of plasma treating, flame treating, and applying a primer.

17. The display module of claim 5, wherein the polymer encapsulating member comprises a silicone or polyurethane material.

18. The display module of claim 5, wherein each of the plurality of light-emitting elements are mounted directly to the one or more of the plurality of electrical connection pads.

* * * * *